(12) United States Patent
Shin et al.

(10) Patent No.: US 12,161,025 B2
(45) Date of Patent: Dec. 3, 2024

(54) DISPLAY APPARATUS

(71) Applicant: LG Display Co., Ltd., Seoul (KR)

(72) Inventors: HyunGi Shin, Paju-si (KR); HeeKwang Kang, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 629 days.

(21) Appl. No.: 17/466,612

(22) Filed: Sep. 3, 2021

(65) Prior Publication Data

US 2022/0077262 A1 Mar. 10, 2022

(30) Foreign Application Priority Data

Sep. 4, 2020 (KR) .................. 10-2020-0112923

(51) Int. Cl.
| | |
|---|---|
| *H10K 59/124* | (2023.01) |
| *H10K 59/121* | (2023.01) |
| *H10K 59/122* | (2023.01) |
| *H10K 59/131* | (2023.01) |
| *H10K 59/80* | (2023.01) |

(52) U.S. Cl.
CPC ....... *H10K 59/124* (2023.02); *H10K 59/1213* (2023.02); *H10K 59/122* (2023.02); *H10K 59/131* (2023.02); *H10K 59/873* (2023.02)

(58) Field of Classification Search
CPC .................. H10K 59/12–1315; H10K 59/873
See application file for complete search history.

(56) References Cited

U.S. PATENT DOCUMENTS

| | | | | |
|---|---|---|---|---|
| 2009/0153042 | A1* | 6/2009 | Izumi | H10K 59/124 |
| | | | | 313/504 |
| 2018/0342707 | A1* | 11/2018 | Lee | H10K 50/844 |
| 2020/0264484 | A1* | 8/2020 | Jinnai | H01L 27/124 |

FOREIGN PATENT DOCUMENTS

| | | |
|---|---|---|
| KR | 10-2019-0073867 A | 6/2019 |
| KR | 10-2020-0037908 A | 4/2020 |

* cited by examiner

*Primary Examiner* — Daniel P Shook
(74) *Attorney, Agent, or Firm* — Birch, Stewart, Kolasch & Birch, LLP

(57) ABSTRACT

A display apparatus can include a substrate comprising a plurality of subpixels, a display area, and a non-display area; a first insulating layer disposed on the substrate; a plurality of first electrodes disposed on the first insulating layer and disposed at the plurality of subpixels, respectively; a bank disposed between the plurality of subpixels; a hole configured to divide the first insulating layer into an inner first insulating layer portion and an outer first insulating layer portion in the non-display area at a periphery of the display area, the inner first insulating layer portion being closer to the display area than the outer first insulating layer portion; a first layer disposed under the hole between the inner first insulating layer portion and the outer first insulating layer portion; and an organic layer and a second electrode disposed on the plurality of first electrodes.

23 Claims, 25 Drawing Sheets

DISPLAY APPARATUS

CROSS-REFERENCE TO RELATED APPLICATIONS

This application claims the benefit of priority to Korean Patent Application No. 10-2020-0112923 filed on Sep. 4, 2020, in the Republic of Korea, the entirety of which is incorporated herein by reference into the present application.

BACKGROUND

Technical Field

The present disclosure relates to a display apparatus, and more particularly, to a display apparatus capable of inhibiting or preventing moisture from permeating into a display area.

Description of the Related Art

Recently, display apparatuses, which visually display electrical information signals, are being rapidly developed in accordance with the full-fledged entry into the information era. Various studies are being continuously conducted to develop a variety of display apparatuses which are thin and lightweight, consume low power, and have improved performance.

Among the various display apparatuses, an electroluminescent display apparatus (e.g., an OLED display) refers to a display apparatus that autonomously emits light. Unlike a liquid crystal display apparatus, the electroluminescent display apparatus does not need a separate light source and thus may be manufactured as a lightweight, thin display apparatus.

In addition, the electroluminescent display apparatus is advantageous in terms of power consumption because the electroluminescent display apparatus operates at a low voltage. Further, the electroluminescent display apparatus is adopted as the next-generation display apparatus because the electroluminescent display apparatus has excellent color implementation, response speed, viewing angle, and contrast ratio.

SUMMARY OF THE DISCLOSURE

The electroluminescent display apparatus is used for various products in various fields because the electroluminescent display apparatus may be ultrathin and excellent in flexibility. However, the electroluminescent display apparatus may be disadvantageously vulnerable to moisture and oxygen. Due to this disadvantage, a method capable of suppressing permeation of outside moisture and oxygen may be important in order to use the electroluminescent display apparatus in various fields and develop the electroluminescent display apparatus as various types of display apparatuses.

The inventors of the present disclosure have recognized that a planarization layer configured as an organic film can serve as a permeation path of moisture and an inflow path of moisture increases in a dual planarization layer structure.

Accordingly, an object of the present disclosure is to provide a display apparatus, in which a hole or a trench for suppressing permeation of moisture from the outside is formed by removing a planarization layer from a non-display area at the periphery of a display area, and a moisture permeation inhibiting layer is additionally formed below the hole or the trench, thereby minimizing or reducing permeation of moisture into the display area from the non-display area.

Another object of the present disclosure is to provide a display apparatus, in which a moisture permeation inhibiting layer is formed in a stepwise manner at an edge or a periphery of a hole or a trench so as to cover a planarization layer, thereby minimizing or reducing permeation of moisture.

Another object of the present disclosure is to provide a display apparatus capable of minimizing or reducing permeation of moisture regardless of a structure of a substrate or a structure of a transistor.

Additional features and aspects will be set forth in part in the description that follows, and in part will become apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

A display apparatus according to an embodiment of the present disclosure can include a substrate including a plurality of subpixels, a display area, and a non-display area, an insulating layer disposed on the substrate, first electrodes disposed on the insulating layer and disposed on the plurality of subpixels, respectively, a bank disposed between the plurality of subpixels, a hole configured to divide the insulating layer into an insulating layer inside the non-display area and an insulating layer outside the non-display area in the non-display area at the periphery of the display area, a first layer disposed under the hole between the inside of the non-display area and the outside of the non-display area, and an organic layer and second electrodes disposed on the plurality of first electrodes.

According to some embodiments of the present disclosure, it is possible to inhibit or prevent moisture from permeating into the display area from the outside, thereby ensuring reliability of the display apparatus and ensuring the lifespan of the product.

According to some embodiments of the present disclosure, it is possible to inhibit or prevent the permeation of moisture without changing the mask and the process, thereby improving the process properties and manufacturing efficiency.

Other systems, methods, features and aspects will be, or will become, apparent to one with skill in the art upon examination of the following figures and detailed description. It is intended that all such additional systems, methods, features and aspects be included within this description, be within the scope of the present disclosure, and be protected by the following claims. Nothing in this section should be taken as a limitation on those claims. Further aspects and features are discussed below in conjunction with embodiments of the disclosure.

It is to be understood that both the foregoing general description and the following examples in the detailed description of the present disclosure are explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure.

DETAILED DESCRIPTION OF THE EMBODIMENTS

Figure 1:
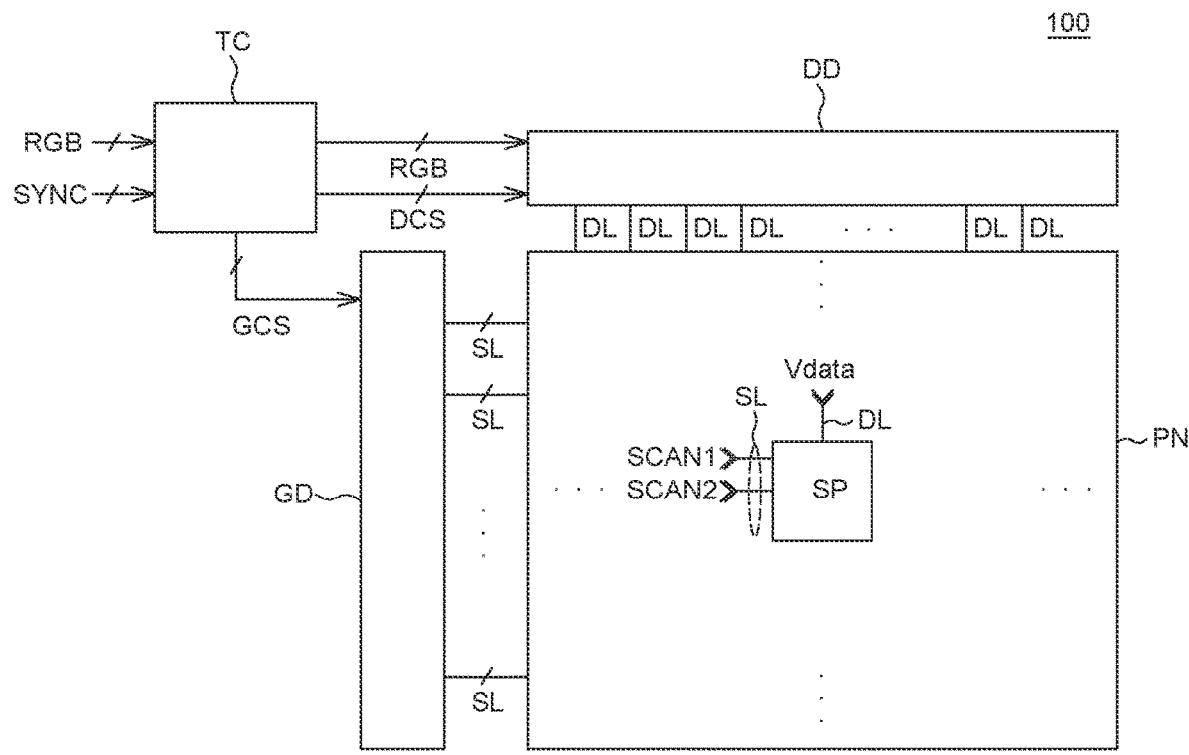
FIG. 1 is a configuration view of a display apparatus according to an embodiment of the present disclosure.

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example: however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

The shapes, sizes, ratios, angles, numbers, and the like disclosed in the drawings for describing embodiments of the present disclosure are merely examples, and thus, the present disclosure is not limited to the illustrated details. Like reference numerals refer to like elements throughout. In the following description, when the detailed description of the relevant known function or configuration is determined to unnecessarily obscure aspects of the present disclosure, the detailed description will be omitted. When "comprise," "have," and "include" described in the present specification are used, another part may be added unless "only" is used. The terms of a singular form may include plural forms unless referred to the contrary.

In construing an element, the element is construed as including an error or tolerance range although there is no explicit description of such an error or tolerance range.

In describing a time relationship, for example, when the temporal order is described as, for example, "after," "subsequent," "next," and "before," a situation that is not continuous may be included unless a more limiting term, such as "just," "immediate(ly)," or "direct(ly)" is used.

In describing a position relationship, for example, when a position relation between two parts is described as, for example, "on," "over," "under," and "next," one or more other parts may be disposed between the two parts unless a more limiting term, such as "just" or "direct(ly)" is used.

It will be understood that, although the terms "first," "second," etc. may be used herein to describe various elements, these elements should not be limited by these terms. These terms are only used to distinguish one element from another, and may not define order. For example, a first element could be termed a second element, and, similarly, a second element could be termed a first element, without departing from the scope of the present disclosure.

A size and a thickness of each component illustrated in the drawing are illustrated for convenience of description, and the present disclosure is not limited to the size and the thickness of the component illustrated.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to accompanying drawings. For convenience of description, a scale of each of elements illustrated in the accompanying drawings may differ from a real scale, and thus, is not limited to a scale illustrated in the drawings.

FIG. 1 is a configuration view of a display apparatus according to a first embodiment of the present disclosure. All the components of each display apparatus according to all embodiments of the present disclosure are operatively coupled and configured.

Particularly, FIG. 1 illustrates a display panel PN, a gate driver GD, a data driver DD, and a timing controller TC, among various components of a display apparatus 100. However, embodiments of the present disclosure are not limited thereto.

With reference to FIG. 1, the display apparatus 100 can include the display panel PN including a plurality of subpixels SP, the gate driver GD and the data driver DD configured to supply various types of signals to the display panel PN, and the timing controller TC configured to control the gate driver GD and the data driver DD.

The gate driver GD can supply a plurality of scan signals to a plurality of scan lines SL based on a plurality of gate control signals GCS provided from the timing controller TC. The plurality of scan signals can include a first scan signal SCAN1 and a second scan signal SCAN2. FIG. 1 illustrates that the single gate driver GD is disposed at one side of the display panel PN so as to be spaced apart from the display panel PN. However, the gate driver GD can be disposed at a GIP (Gate In Panel) manner, and the number of and the disposition of the gate driver GD is not limited thereto.

The data driver DD can convert image data RGB, which are inputted from the timing controller TC based on the plurality of data control signals DCS provided from the timing controller TC, into a data signal using a reference gamma voltage. Further, the data driver DD can supply the converted data signal to a plurality of data lines DL.

The timing controller TC can align the image data RGB inputted from the outside and supply the aligned image data RGB to the data driver DD.

The timing controller TC can create the gate control signals GCS and the data control signals DCS using synchronizing signals (SYNC), for example, dot clock signals, data enable signals, and horizontal/vertical synchronizing signals inputted from the outside. Further, the timing controller TC can control the gate driver GD and the data driver DD by supplying the created gate control signal GCS and the created data control signal DCS to the gate driver GD and the data driver DD.

The display panel PN is configured to display images to a user and can include the plurality of subpixels SP. In the display panel PN, the plurality of scan lines SL and the plurality of data lines DL can intersect one another, and each of the plurality of subpixels SP can be connected to the scan line SL and the data line DL. In addition, each of the plurality of subpixels SP can be connected to a high-potential power line, a low-potential power line, an initialization signal line, a light emission control signal line, and the like.

The subpixel SP is a minimum unit that constitutes a screen. Each of the plurality of subpixels SP can include a light emitting element and a pixel circuit for driving the light emitting element. The plurality of light emitting elements can have different configurations depending on the type of display panel PN. For example, in a situation in which the display panel PN is an organic light emitting display panel, the light emitting element can be an organic light emitting element including an anode, a light emitting part, and a cathode. Hereinafter, the description is made on the assumption that the light emitting element is the organic light emitting element. However, the scope of the present disclosure is not limited by the type of light emitting element.

The pixel circuit refers to a circuit for controlling an operation of the light emitting element. For example, the pixel circuit can include a plurality of transistors and a capacitor, but embodiments of the present disclosure are not limited thereto.

Hereinafter, the pixel circuit of the subpixel SP will be described in more detail with reference to FIG. 2.

Figure 2:
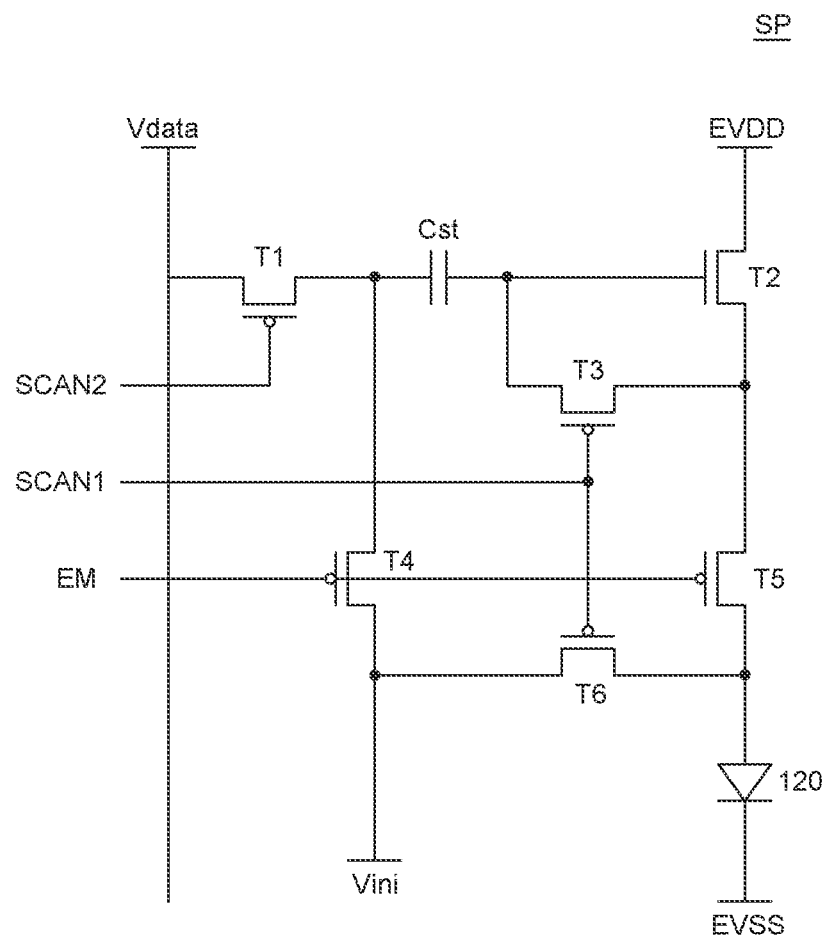
FIG. 2 is a subpixel circuit diagram of the display apparatus according to an embodiment of the present disclosure.

FIG. 2 is a subpixel circuit diagram of the display apparatus according to the first embodiment of the present disclosure.

With reference to FIG. 2, the pixel circuit of each of the plurality of subpixels SP can include first to sixth transistors T1, T2, T3, T4, T5, and T6 and a capacitor Cst.

The first transistor T1 is connected to a second scan line and can be controlled by the second scan signal SCAN2 supplied through the second scan line. The first transistor T1 is electrically connected between the capacitor Cst and a data line for supplying a data signal Vdata. When the second scan signal SCAN2 of a turn-on level is applied through the second scan line, the first transistor T1 can transmit the data signal Vdata from the data line to the capacitor Cst. The first transistor T1 can refer to a switching transistor for controlling a timing of applying the data signal Vdata to the capacitor Cst.

The second transistor T2 can be electrically connected between the fifth transistor T5 and the high-potential power line to which a high-potential power signal EVDD is supplied. Further, a gate electrode of the second transistor T2 can be electrically connected to the capacitor Cst. The second transistor T2 can refer to a driving transistor for controlling brightness of a light emitting element 120 by controlling a current flowing to the light emitting element 120 depending on a voltage applied to the gate electrode.

In addition, the third transistor T3 can be controlled based on the first scan signal SCAN1 supplied through a first scan line. The third transistor T3 can be electrically between a gate electrode and a drain electrode of the second transistor T2 or between the gate electrode and a source electrode of the second transistor T2 depending on the type of third transistor T3.

The second transistor T2, which is the driving transistor, needs to control the current flowing to the light emitting element 120 depending on the data signal Vdata applied to the subpixel SP. However, a deviation of brightness can occur between the light emitting elements 120 disposed on the subpixels SP due to a deviation of threshold voltage between the second transistors T2 disposed on the subpixels SP, respectively.

The third transistor T3 can be disposed to compensate for the threshold voltage of the second transistor T2, and the third transistor T3 can refer to a compensation transistor. For example, in a situation in which the first scan signal SCAN1 for turning on the third transistor T3 is applied, a voltage made by subtracting the threshold voltage of the second transistor T2 from the high-potential power signal EVDD can be applied to the gate electrode of the second transistor T2. The threshold voltage of the second transistor T2 can be compensated by applying the data signal Vdata to the capacitor Cst in the state in which the high-potential power signal EVDD from which the threshold voltage is subtracted is applied to the gate electrode of the second transistor T2.

The third transistor T3 and the first transistor T1 are illustrated as being supplied with the different scan signals SCAN1 and SCAN2 through the different scan lines. However, the third transistor T3 and the first transistor T1 can be connected with the same scan line and supplied with the same scan signal SCAN1 and SCAN2, but embodiments of the present disclosure are not limited thereto.

The fourth transistor T4 can be electrically connected to the capacitor Cst and an initialization signal line through which an initialization signal Vini is supplied. Further, the fourth transistor T4 can be controlled based on a light emission control signal EM supplied through the light emission control signal line. When the light emission control signal EM of a turn-on level is applied through the light emission control signal line, the fourth transistor T4 initializes the voltage of the capacitor Cst or slowly discharges the data signal Vdata applied to the capacitor Cst, thereby enabling the current, which is determined based on the data signal Vdata, to the light emitting element 120.

In addition, the fifth transistor T5 can be electrically connected between the second transistor T2 and the light emitting element 120 and can be controlled based on the light emission control signal EM supplied through the light emission control signal line. When the light emission control signal EM of the turn-on level is applied in the state in which the data signal Vdata is applied to the capacitor Cst and the high-potential power signal EVDD with the compensated threshold voltage is applied to the gate electrode of the second transistor T2, the fifth transistor T5 can be turned on to allow the current to flow to the light emitting element 120.

The sixth transistor T6 can be electrically connected between the anode of the light emitting element 120 and the initialization signal line through which the initialization signal Vini is supplied. The sixth transistor T6 can be controlled based on the first scan signal SCAN1 supplied through the first scan line. When the first scan signal SCAN1 of the turn-on level is applied through the first scan line, the sixth transistor T6 can initialize, with the initialization signal Vini, the anode of the light emitting element 120 or a node between the second transistor T2 and the fifth transistor T5.

The capacitor Cst can be a storage capacitor Cst that stores the voltage applied to the gate electrode of the second transistor T2 which is the driving transistor. In this situation, the capacitor Cst can be electrically connected between the gate electrode of the second transistor T2 and the anode of the light emitting element 120. Therefore, the capacitor Cst can store a difference between the voltage of the gate electrode of the second transistor T2 and the voltage supplied to the anode of the light emitting element 120.

The example in which the pixel circuit of the subpixel SP includes the first to sixth transistors T1, T2, T3, T4, T5, and T6 and the capacitor Cst has been described above, but embodiments of the present disclosure are not limited thereto. For example, the pixel circuit of the subpixel SP can further include a seventh transistor. As another example, the pixel circuit of the subpixel SP can include the first to fourth transistor and the two capacitors.

Hereinafter, the subpixel SP of the display apparatus 100 according to the first embodiment of the present disclosure will be described in more detail with reference to FIGS. 3, 4A, and 4B.

Figure 3:
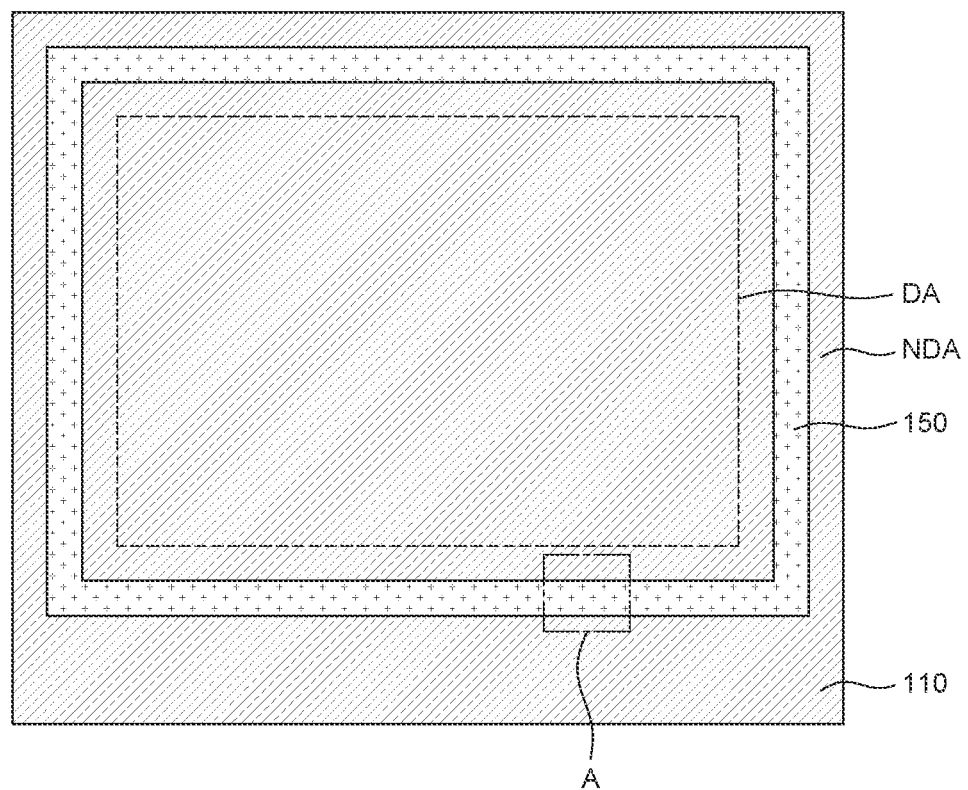
FIG. 3 is a top plan view of a display panel according to an embodiment of the present disclosure.

FIG. 3 is a top plan view of the display panel according to the first embodiment of the present disclosure.

Figure 4:
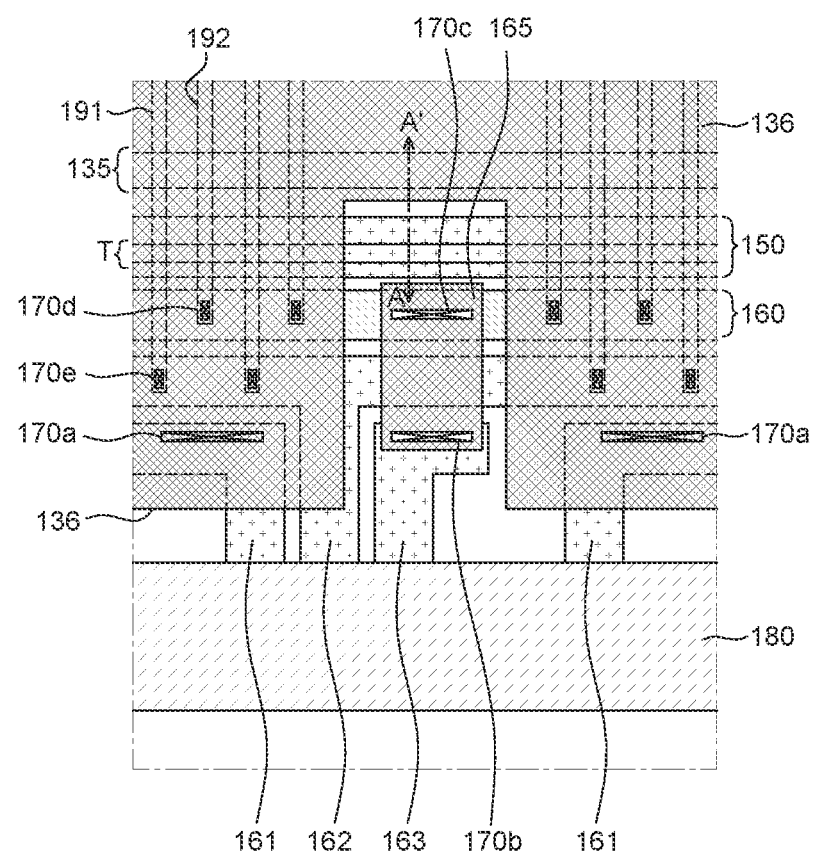
FIG. 4 is a top plan view illustrating enlarged part A of the display panel illustrated in FIG. 3 according to an embodiment of the present disclosure.

FIG. 4 is a top plan view illustrating enlarged part A of the display panel illustrated in FIG. 3.

Figure 5A:
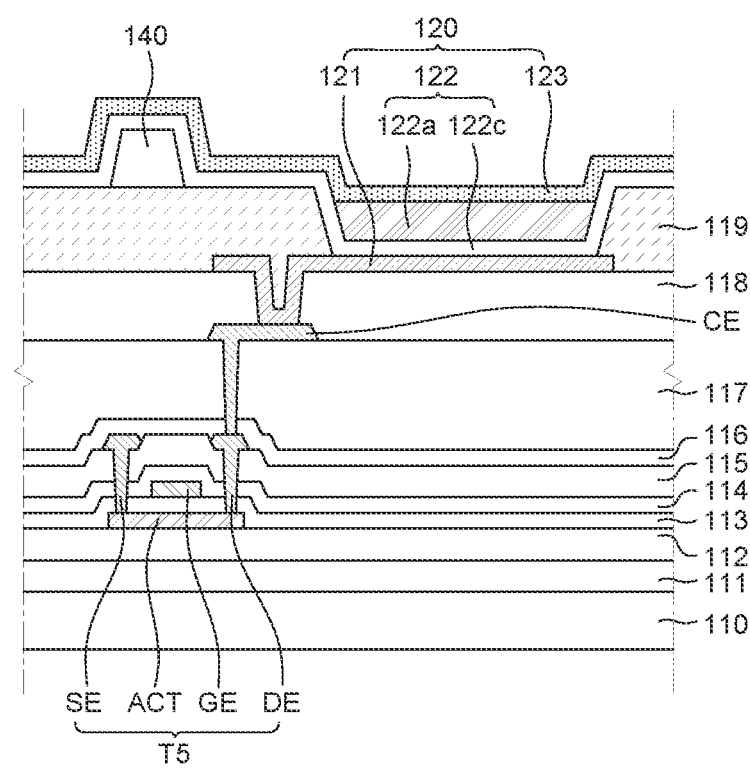
FIG. 5A is a cross-sectional view illustrating a part of a display area of the display panel illustrated in FIG. 3 according to an embodiment of the present disclosure.

FIG. 5A is a cross-sectional view illustrating a part of a cross-sectional structure of a single subpixel on the display panel PN illustrated in FIG. 3.

Figure 5B:
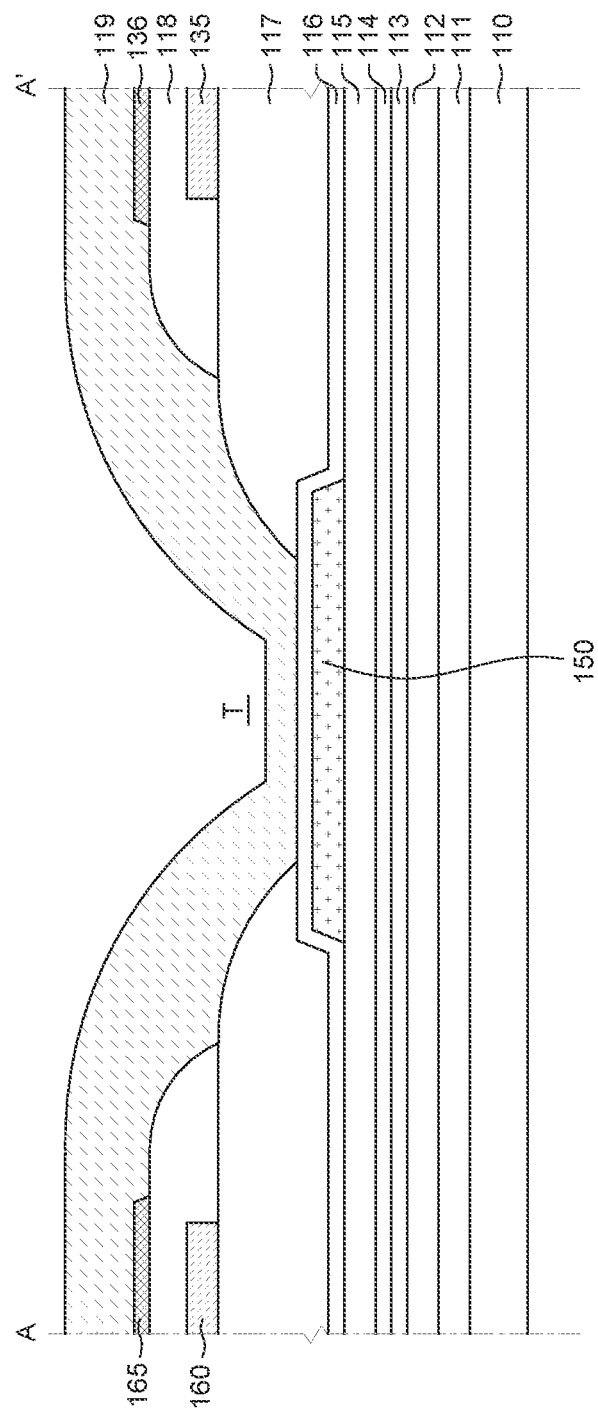
FIG. 5B is a cross-sectional view taken along line A-A' in FIG. 4 according to an embodiment of the present disclosure

FIG. 5B is a cross-sectional view taken along line A-A' in FIG. 4.

FIG. 4 illustrates a non-display area NDA in which a source drive IC is positioned, for example, enlarged A region. FIG. 5A illustrates a part of a cross-sectional structure of a single subpixel on the display panel PN illustrated in FIG. 3.

With reference to FIGS. 3, 4, 5A, and 5B, the display apparatus according to the first embodiment of the present disclosure can include a substrate 110, the fifth transistor T5, the light emitting element 120, third upper and lower insulating layers 118 and 117, and a bank 119.

For convenience of description, FIG. 5A illustrates only the fifth transistor T5 among the plurality of transistors T1, T2, T3, T4, T5, and T6 and the capacitor Cst of the pixel circuit of the subpixel SP illustrated in FIG. 2. However, embodiments of the present disclosure are not limited thereto.

The display panel PN can be divided into a display area DA in which the subpixels are disposed to display images, and the non-display area NDA that displays no image. In the display area DA, a plurality of gate lines, the data lines, and the subpixels can be disposed. In the non-display area NDA, a gate driving part, a data driving part, and a plurality of pads can be disposed. However, embodiments of the present disclosure are not limited thereto.

The gate driving part can be provided in a GIP (Gate Driver In Panel) manner and disposed at the non-display area DA at one side or both sides of the display panel PN. Alternately, the gate driving part can be manufactured in the form of a driving chip and mounted on a flexible film. The gate driving part can be attached, in a TAB (Tape Automated Bonding) manner, to the non-display area DA of the display panel PN. In addition, in the situation in which the source drive IC is manufactured in the form of a driving chip, the data driving part can be mounted on a flexible film in a COF (Chip On Film) manner or a COP (Chip On Plastic) manner. Hereinafter, for convenience of description, an example in which the source drive IC is mounted on a flexible film 180 in the COF manner will be described, but embodiments of the present disclosure are not limited thereto.

Each of the plurality of subpixels is an individual unit configured to emit light, and the light emitting elements 120 can be disposed on the plurality of subpixels, respectively. The plurality of subpixels can include a first subpixel, a second subpixel, and a third subpixel that emit light beams with different colors. For example, the first subpixel can be a blue subpixel, the second subpixel can be a green subpixel, and the third subpixel can be a red subpixel. However, embodiments of the present disclosure are not limited thereto. For example, the plurality of subpixels can be configured by laminating two or more structures. The first subpixel, the second subpixel, and the third subpixel of the plurality of subpixels, which are included in laminated first and second structures, can have the same color. As another example, the plurality of subpixels can further include a white subpixel. As still another example, the plurality of subpixels can be configured by laminating three or more structures. The light emitting elements included in the three or more structures can include a light emitting layer configured to implement the white color. Among a blue-light emitting layer, a green-light emitting layer, a yellow-green-light emitting layer, and a red-light emitting layer, one or more light emitting layers are laminated, such that the light emitting layer having the three-phase structure can be implemented.

The plurality of subpixels can be defined (or divided) by a bank 119. For example, in the subpixel, the bank 119 can be disposed to partially cover the third upper and lower insulating layers 118 and 117 and a first electrode 121 of the light emitting element 120. The substrate 110 can include a light emitting region and a non-light emitting region. For example, in the non-light emitting region, the bank 119 can be disposed on the first electrode 121 to inhibit or prevent light from being created in the non-light emitting region. In contrast, because the bank 119 is not disposed at the light emitting region, an organic layer 122 can be disposed directly on the first electrode 121, such that light can be created by the organic layer 122.

A plurality of spacers 140 can be disposed between the plurality of subpixels SP. A fine metal mask (FMM), which is a deposition mask, can be used to form the light emitting elements 120 on the plurality of subpixels SP. For example, the plurality of spacers 140 can inhibit or prevent damage caused by contact with the deposition mask and maintain a constant distance between the deposition mask and the substrate 110.

The plurality of subpixels for displaying images is disposed at the display area DA. Each of the subpixels can include the light emitting element 120 having at least one transistor T5, the first electrode 121, the organic layer 122, and a second electrode 123. In this situation, when the gate signal is inputted from the gate line, each of the subpixels uses the transistor T5 to supply a predetermined current to the light emitting element 120 based on the data voltage of the data line. Therefore, the light emitting element 120 of each of the transistors T5 can emit light with predetermined brightness based on the predetermined current.

The substrate 110 is a support member for supporting other components of the display apparatus and can be formed of an insulating material. For example, the substrate 110 can be formed of glass, resin, or the like. In addition, the substrate 110 can include plastic such as polymer or polyimide (PI) and can be formed of a material having flexibility.

A first buffer layer 111 can be disposed on the substrate 110. The first buffer layer 111 may reduce permeation of moisture or impurities through the substrate 110. For example, the first buffer layer 111 may have a single layer or a plurality of layers formed of silicon oxide (SiOx) or silicon nitride (SiNx), but embodiments of the present disclosure are not limited thereto. However, the first buffer layer 111 may be omitted in accordance with the type of substrate 110 or the type of transistor, but embodiments of the present disclosure are not limited thereto.

A second buffer layer 112 can be disposed on the first buffer layer 111.

The second buffer layer 112 can be provided to inhibit or prevent elution of alkaline materials in the substrate 110 which can be produced during a subsequent process such as crystallization of an active layer ACT.

For example, the second buffer layer 112 can have a single layer or a plurality of layers formed of silicon oxide (SiOx) or silicon nitride (SiNx), but embodiments of the present disclosure are not limited thereto.

The fifth transistor T5 can be disposed on the second buffer layer 112.

The fifth transistor T5 can include the active layer ACT, a gate electrode GE, a source electrode SE, and a drain electrode DE.

The active layer ACT can be formed of a semiconductor material such as an oxide semiconductor, amorphous silicon, or polysilicon, but embodiments of the present disclosure are not limited thereto. For example, in the situation in which the active layer ACT is formed of oxide semiconductor, the active layer ACT can include a channel region, a source region, and a drain region, and the source region and the drain region can be regions having conductivity, but embodiments of the present disclosure are not limited thereto.

A first insulating layer 113 can be disposed on the active layer ACT. The first insulating layer 113 can be a gate insulating layer, but embodiments of the present disclosure are not limited thereto.

The first insulating layer 113 is an insulating layer for insulating the active layer ACT and the gate electrode GE. The first insulating layer 113 can have a single layer or a plurality of layers formed of silicon oxide (SiOx) or silicon nitride (SiNx), but embodiments of the present disclosure are not limited thereto.

The gate electrode GE can be disposed on the first insulating layer 113.

In this situation, the gate electrode GE can be formed of an electrically conductive material, for example, copper (Cu), aluminum (Al), molybdenum (Mo), nickel (Ni), titanium (Ti), chromium (Cr), or an alloy thereof, but embodiments of the present disclosure are not limited thereto.

A plurality of power lines can be disposed on the first insulating layer 113 from the non-display area NDA to the display area DA. FIG. 4 illustrates a high-potential power line 191 and a reference voltage line 192 as examples of the power lines, but embodiments of the present disclosure are not limited thereto. The high-potential power line 191 and the reference voltage line 192 can be disposed on the same layer as the gate electrode GE and formed of the same electrically conductive material as the gate electrode GE, but embodiments of the present disclosure are not limited thereto.

A first interlayer insulating layer 114 can be disposed on the gate electrode GE, the high-potential power line 191, and the reference voltage line 192.

A second interlayer insulating layer 115 can be disposed on the first interlayer insulating layer 114. However, the second interlayer insulating layer 115 can be omitted, but embodiments of the present disclosure are not limited thereto.

Active contact holes for connecting the source electrode SE and the drain electrode DE to the source region and the drain region of the active layer ACT can be formed at the first insulating layer 113, the first interlayer insulating layer 114, and the second interlayer insulating layer 115.

In addition, a fifth contact hole 170e for connecting a second link line 162 to the high-potential power line 191 can be formed in the first interlayer insulating layer 114 and the second interlayer insulating layer 115.

Each of the first interlayer insulating layer 114 and the second interlayer insulating layer 115 may have a single layer or a plurality of layers formed of silicon oxide (SiOx) or silicon nitride (SiNx), but embodiments of the present disclosure are not limited thereto.

The source electrode SE and the drain electrode DE may be disposed on the second interlayer insulating layer 115. The source electrode SE and the drain electrode DE disposed to be spaced apart from each other can be electrically connected to the active layer ACT through the contact hole. Each of the source electrode SE and the drain electrode DE can be formed of an electrically conductive material, for example, copper (Cu), aluminum (Al), molybdenum (Mo), nickel (Ni), titanium (Ti), chromium (Cr), or an alloy thereof, but embodiments of the present disclosure are not limited thereto.

A data line can be disposed on the second interlayer insulating layer 115. For example, the data line can be disposed on the same layer as the source electrode SE and the drain electrode DE and can be formed of the same electrically conductive material as the source electrode SE and the drain electrode DE, but embodiments of the present disclosure are not limited thereto.

In addition, in the non-display area NDA, a plurality of link lines 161, 162, and 163 can be disposed on the second interlayer insulating layer 115. As an example, FIG. 4 illustrates that the link lines 161, 162, and 163 include a first link line 161 for transmitting a low-potential voltage, a second link line 162 for transmitting a high-potential voltage, and a third link line 163 for transmitting a reference voltage, but embodiments of the present disclosure are not limited thereto.

A second insulating layer 116 can be disposed on the link lines 161, 162, and 163, the data line, the source electrode SE, and the drain electrode DE. The second insulating layer 116 can be a protective layer, but embodiments of the present disclosure are not limited thereto. The second insulating layer 116 can be an insulating layer for protecting components disposed under the second insulating layer 116. For example, the second insulating layer 116 can have a single layer or a plurality of layers formed of silicon oxide (SiOx) or silicon nitride (SiNx), but embodiments of the present disclosure are not limited thereto. In addition, the second insulating layer 116 can be omitted in accordance with the embodiments.

A fourth contact hole 170d for connecting a reference voltage electrode 160 to the reference voltage line 192 can be formed in the first interlayer insulating layer 114, the second interlayer insulating layer 115, and the second insulating layer 116.

In addition, a first contact hole 170a for connecting a third layer 136 to the first link line 161 can be formed in the second insulating layer 116.

The third lower insulating layer 117 can be disposed on the second insulating layer 116. The third lower insulating layer 117 can be a first planarization layer, but embodiments of the present disclosure are not limited thereto. The third lower insulating layer 117 can be omitted in accordance with the embodiments.

The third lower insulating layer 117 can be an insulating layer for planarizing an upper portion of the substrate 110. The third lower insulating layer 117 can be formed of an organic material. For example, the third lower insulating layer 117 can have a single layer or a plurality of layers formed of polyimide or photo acryl, but embodiments of the present disclosure are not limited thereto.

A drain contact hole for connecting the first electrode 121 to the drain electrode DE can be formed in the second insulating layer 116 and the third lower insulating layer 117.

A connection electrode CE can be disposed on the third lower insulating layer 117, but embodiments of the present disclosure are not limited thereto. In addition, the connection electrode CE can be omitted in accordance with embodiments of the present disclosure.

The connection electrode CE can be electrically connected to the drain electrode DE through the contact hole. The connection electrode CE can be formed of an electrically conductive material, for example, copper (Cu), aluminum (Al), molybdenum (Mo), nickel (Ni), titanium (Ti), chromium (Cr), or an alloy thereof, but embodiments of the present disclosure are not limited thereto. For example, the connection electrode CE can be a second drain electrode.

In the non-display area NDA, the reference voltage electrode 160 and a second layer 135 can be disposed on the third lower insulating layer 117. For example, the reference voltage electrode 160 can be disposed on the same layer as the connection electrode CE and formed of the same material as the connection electrode CE, but embodiments of the present disclosure are not limited thereto.

The third upper insulating layer 118 can be disposed on the connection electrode CE. The third upper insulating layer 118 can be a second planarization layer. However, embodiments of the present disclosure are not limited thereto, and the third upper insulating layer 118 can be omitted in accordance with embodiments of the present disclosure.

The third upper insulating layer 118 can be an insulating layer for planarizing the upper portion of the substrate 110. The third upper insulating layer 118 can be formed of an organic material. For example, the third upper insulating layer 118 can have a single layer or a plurality of layers formed of polyimide or photo acryl, but embodiments of the present disclosure are not limited thereto.

The plurality of light emitting elements 120 can be disposed on the plurality of subpixels SP on the third upper insulating layer 118. The light emitting element 120 can include the first electrode 121, the organic layer 122, and the second electrode 123. The organic layer 122 can include a light emitting layer 122a disposed at the light emitting region, and a common layer 122c disposed on the entire surface of the substrate 110 including the light emitting region.

The first electrode 121, which is the anode, can be disposed on the third upper insulating layer 118.

The first electrode 121 can be electrically connected to the fifth transistor T5 and supplied with a drive current of the pixel circuit. In this situation, because the first electrode 121 supplies holes to the light emitting layer 122a, the first electrode 121 can be formed of an electrically conductive material having a high work function. For example, the first electrode 121 can be formed of an electrically conductive transparent material such as indium tin oxide (ITO) or indium zinc oxide (IZO), but embodiments of the present disclosure are not limited thereto.

The display apparatus can be implemented in a top emission manner or a bottom emission manner. In the top emission type display apparatus, a reflective layer, which is formed of a metal material, for example, aluminum (Al) or silver (Ag) excellent in reflection efficiency, can be additionally provided at a lower side of the first electrode 121 so that the light emitted from the light emitting layer 122a is reflected by the first electrode 121 and then directed upward, for example, toward the second electrode 123. On the contrary, in the bottom emission type display apparatus, the first electrode 121 can be formed of only an electrically conductive transparent material. Hereinafter, the description will be made on the assumption that the display apparatus according to the first embodiment of the present disclosure is the top emission type display apparatus.

The first electrode 121 can have a layered structure having two or more layers including the reflective layer.

In the non-display area NDA, a connection electrode 165 and the third layer 136 can be disposed on the third upper insulating layer 118. The connection electrode 165 and the third layer 136 can be formed on the same layer as the first electrode 121 and formed of the same material as the first electrode 121, but embodiments of the present disclosure are not limited thereto.

The connection electrode 165 can be connected to the third link line 163 through the second contact hole 170*b*. In addition, the connection electrode 165 can be connected to the reference voltage electrode 160 through a third contact hole 170*c*. Therefore, the reference voltage can be transmitted to the reference voltage line 192 through the connection electrode 165 and the reference voltage electrode 160.

The connection electrode 165 can be separated from the third layer 136 and disposed at a region from which a part of the third layer 136 on which the third link line 163 is positioned is removed.

The third layer 136 extends to the display area DA and can be connected to the second electrode 123 through the predetermined contact hole.

In the non-display area NDA at the periphery of the display area DA, a predetermined trench or hole T (hereinafter, referred to as a hole T including a trench) can be formed by removing the third upper and lower insulating layers 118 and 117 in order to inhibit or prevent the permeation of moisture from the outside.

According to the first embodiment of the present disclosure, the hole T is formed by removing the third upper and lower insulating layers 118 and 117 from the non-display area NDA at the periphery of the display area DA. The hole T is formed to divide the third upper and lower insulating layers 118 and 117 into two portions of the third upper and lower insulating layers 118 and 117. As a result, the second insulating layer 116 under the third upper and lower insulating layers 118 and 117 can be exposed. Therefore, lateral surfaces of the third upper and lower insulating layers 118 and 117 and an upper surface of the second insulating layer 116 can be partially exposed through the hole T.

For example, in the non-display area NDA, the hole T divides the third upper and lower insulating layers 118 and 117 into two portions, specifically, inner and outer portions. As a result, it is possible to inhibit or prevent outside moisture from permeating into the display area DA through the third upper and lower insulating layers 118 and 117 configured as organic films.

The hole T can be disposed at the non-display area NDA so as to surround an edge or a periphery of the display area DA (e.g., the hole T can be viewed similar to a moat around a castle). For example, the hole T can form a continuous and unbroken trench that extends all the way around the display area DA for protecting against moisture penetration. Therefore, the hole T can divide the third upper and lower insulating layers 118 and 117 into the two portions, that is, the inner and outer portions in the non-display area NDA and isolate the inner and outer portions. In this situation, the inner portion of the non-display area NDA means the non-display area NDA at a position close to the display area DA based on the hole T, and the outer portion of the non-display area NDA means the non-display area NDA at a position relatively distant from the display area DA based on the hole T.

In addition, a first layer 150 can be further disposed under the hole T, thereby minimizing or reducing the permeation of moisture into the display area DA. For example, since the first layer 150 is further disposed under the hole T, it is possible to inhibit or prevent the permeation of moisture into a lower portion of the second insulating layer 116. The first layer 150 can be a moisture permeation inhibiting layer or a moisture permeation preventing layer, but embodiments of the present disclosure are not limited by the term (e.g., if moisture tries to creep along an interface or surface among the third upper and lower insulating layers 118 and 117 or through the insulating layers, it can be blocked by the hole T and first layer 150).

The first layer 150 can have a wider width than the hole T, but embodiments of the present disclosure are not limited thereto.

The first layer 150 can be disposed on the second interlayer insulating layer 115 under the hole T, and the second insulating layer 116 can be disposed on the first layer 150. For example, in a situation in which the second insulating layer 116 can be omitted, the third lower insulating layer 117 can be disposed on the first layer 150.

The first layer 150 can be disposed on the same layer as the source electrode SE and the drain electrode DE of the display area DA and formed of the same material as the source electrode SE and the drain electrode DE, but embodiments of the present disclosure are not limited thereto. The first layer 150 can be formed of an electrically conductive material, for example, copper (Cu), aluminum (Al), molybdenum (Mo), nickel (Ni), titanium (Ti), chromium (Cr), or an alloy thereof, but embodiments of the present disclosure are not limited thereto.

As described above, the light emitting element 120 can include the first electrode 121, the organic layer 122, and the second electrode 123.

The organic layer 122 can be disposed between the first electrode 121 and the second electrode 123.

The organic layer 122 refers to a region in which the light is emitted as electrons and holes supplied from the first electrode 121 and the second electrode 123 are combined.

According to the first embodiment of the present disclosure, the organic layer 122 can include the light emitting layers 122*a* disposed on the plurality of subpixels, respectively, and the common layer 122*c* disposed in common on the plurality of subpixels.

The bank 119 can be disposed on the first electrode 121 and the third upper insulating layer 118. The bank 119 is an insulating layer disposed between the plurality of subpixels to divide the plurality of subpixels.

The bank 119 can include an opening portion through which a part of the first electrode 121 is exposed. The bank 119 can be formed of an organic insulating material and disposed to cover an edge (or a periphery) or an edge portion of the first electrode 121. For example, the bank 119 can be formed of polyimide, acryl, or benzocyclobutene (BCB)-based resin, but embodiments of the present disclosure are not limited thereto.

In the non-display area NDA having the hole T, the bank 119 can be disposed to cover not only a lateral surface of the third upper insulating layer 118, but also a lateral surface of the third lower insulating layer 117 and an upper surface of the second insulating layer 116 on the first layer 150 (e.g., the hole T can extend/penetrate through the third upper insulating layer 118 and the third lower insulating layer 117, and a bottom of the hole T can terminate at or abut against an upper surface of the second insulating layer 116 on the first layer 150). However, embodiments of the present disclosure are not limited thereto.

The plurality of spacers 140 can be disposed on the bank 119. The spacer 140 can be disposed on the bank 119 in order to maintain a predetermined distance from the deposition mask at the time of forming the light emitting element 120. The spacer 140 can maintain a predetermined distance between the deposition mask and the bank 119 under the spacer 140 and between the first electrode 121 and the deposition mask, thereby inhibiting or preventing damage caused by contact. The plurality of spacers 140 can have a width gradually decreasing upward, for example, have a tapered shape in order to minimize or reduce an area to be in contact with the deposition mask. However, embodiments of the present disclosure are not limited thereto.

The organic layer 122 can be disposed on the first electrode 121 and the bank 119.

The organic layer 122 can include the light emitting layers 122a disposed on the plurality of subpixels, respectively, and the common layer 122c disposed in common on the plurality of subpixels. The light emitting layer 122a is an organic layer for emitting light with a specific color, and the different light emitting layers 122a can be disposed on the first subpixel, the second subpixel, and the third subpixel, respectively. However, embodiments of the present disclosure are not limited thereto. The plurality of light emitting layer 122a can be disposed on all the subpixels, respectively, to emit white light.

The common layer 122c is an organic layer capable of improving luminous efficiency of the light emitting layer 122a. The common layer 122c can be a single layer formed over the plurality of subpixels. For example, the common layer 122c can be integrally formed by connecting the common layers 122c disposed on the plurality of subpixels, respectively. The common layer 122c can include a hole injecting layer, a hole blocking layer, a hole transporting layer, an electron transporting layer, an electron injecting layer, an electron blocking layer, a charge generating layer, and the like, but embodiments of the present disclosure are not limited thereto.

The second electrode 123 can be disposed on the organic layer 122.

Because the second electrode 123 supplies the electrons to the organic layer 122, the second electrode 123 can be formed of an electrically conductive material with a low work function. The second electrode 123 can be a single layer formed over the plurality of subpixels. For example, the second electrode 123 can be integrally formed by connecting the second electrodes 123 disposed on the plurality of subpixels, respectively. For example, the second electrode 123 can be formed of an electrically transparent conductive material such as indium tin oxide (ITO) or indium zinc oxide (IZO) or formed of an alloy of ytterbium (Yb). The second electrode 123 can further include a metal doping layer, but embodiments of the present disclosure are not limited thereto. In the situation of the bottom emission type display apparatus, the second electrode 123 can be formed of an opaque or semi-transparent metal material, and the color of the light generated by the organic layer 122 can be implemented by a color filter layer positioned under the organic layer 122.

In addition, the second electrode 123 can be electrically connected to the low-potential power line and supplied with a low-potential power signal.

An encapsulation part can be disposed on a second electrode 133. The encapsulation part can be disposed at an upper side the bank 119 and the light emitting element 120 to inhibit or prevent oxygen and moisture from permeating into the display apparatus from the outside.

The encapsulation part can include a first encapsulation layer, a second encapsulation layer, and a third encapsulation layer.

The first encapsulation layer can be disposed on the second electrode 133 to inhibit or prevent the permeation of moisture or oxygen. The first encapsulation layer can be formed of an inorganic material such as silicon nitride (SiNx), silicon oxynitride (SiNxOy), or aluminum oxide (AlyOz), but embodiments of the present disclosure are not limited thereto.

The second encapsulation layer can be disposed on the first encapsulation layer, and a surface of the second encapsulation layer can be planarized. In addition, the second encapsulation layer can cover foreign materials or particles that can be produced during the process of manufacturing the display apparatus. The second encapsulation layer can be formed of an organic material, for example, silicon oxycarbon (SiOxCz), or acrylic or epoxy-based resin, but embodiments of the present disclosure are not limited thereto.

The third encapsulation layer can be disposed on the second encapsulation layer to inhibit or prevent the permeation of moisture or oxygen together with the first encapsulation layer. The third encapsulation layer can be formed of an inorganic material such as silicon nitride (SiNx), silicon oxynitride (SiNxOy), silicon oxide (SiOx), or aluminum oxide (AlyOz), but embodiments of the present disclosure are not limited thereto.

According to the first embodiment of the present disclosure, there can be a likelihood that moisture permeates through the dual planarization layer of the third upper and lower insulating layers 118 and 117 and the bank 119. In another embodiment as described below, a first layer can be formed in a stepwise manner at an edge or a periphery of a hole so as to cover the third upper and lower insulating layers, thereby minimizing or reducing the permeation of moisture (e.g., to block the path of moisture seepage). This configuration will be described in detail with reference to the drawings.

Figure 6:
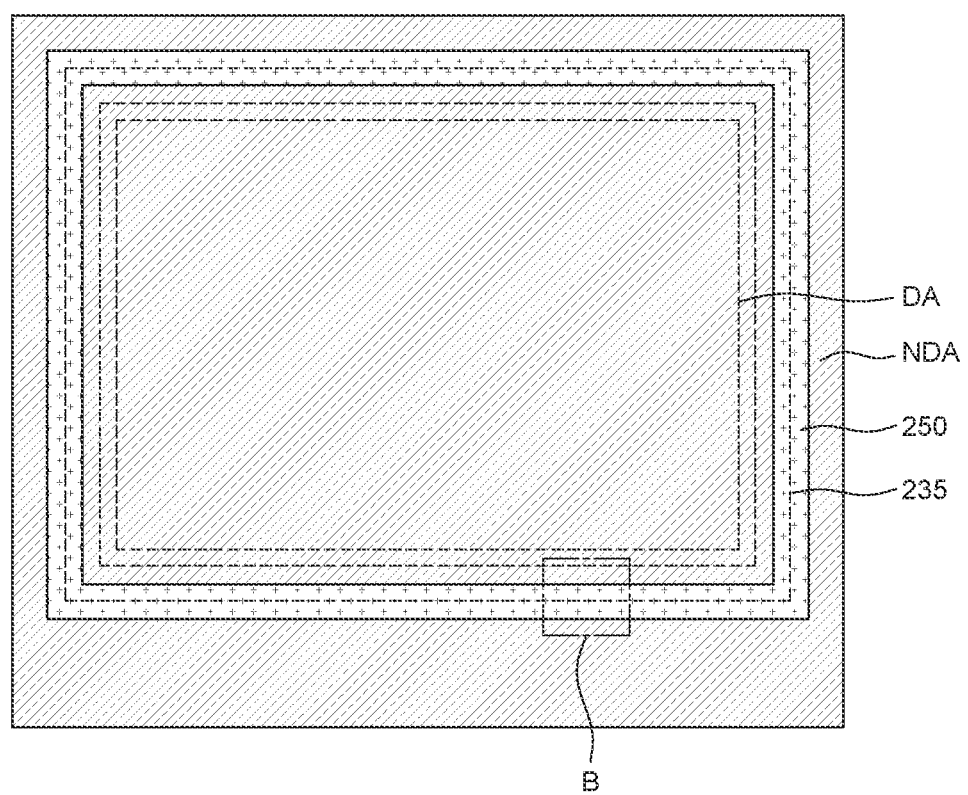
FIG. 6 is a top plan view of a display panel according to another embodiment of the present disclosure.

FIG. 6 is a top plan view of a display panel according to a second embodiment of the present disclosure.

Figure 7A:
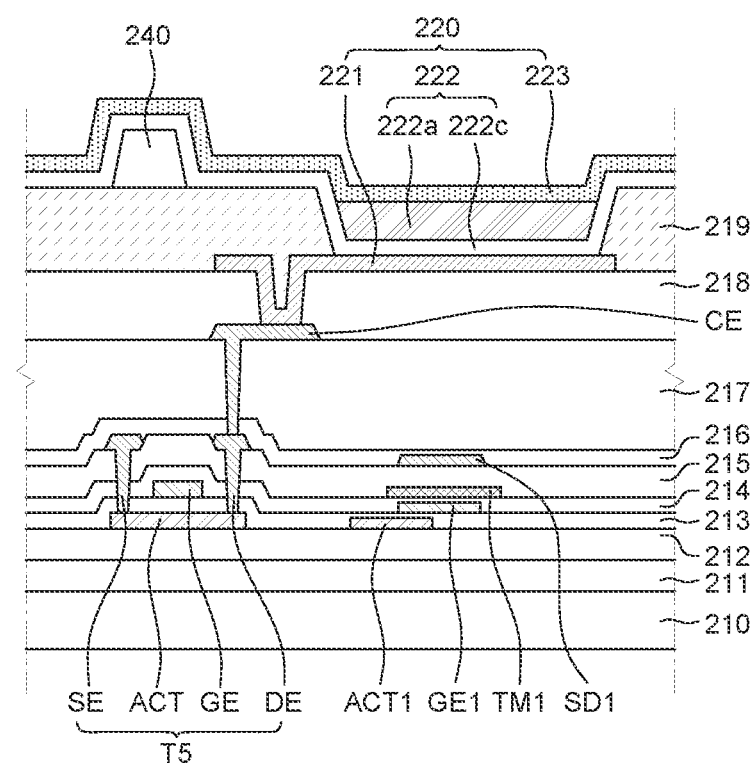
FIG. 7A is a cross-sectional view illustrating a part of a display area of the display panel illustrated in FIG. 6 according to an embodiment of the present disclosure.

FIG. 7A is a cross-sectional view illustrating a part of a display area of the display panel illustrated in FIG. 6.

Figure 7B:
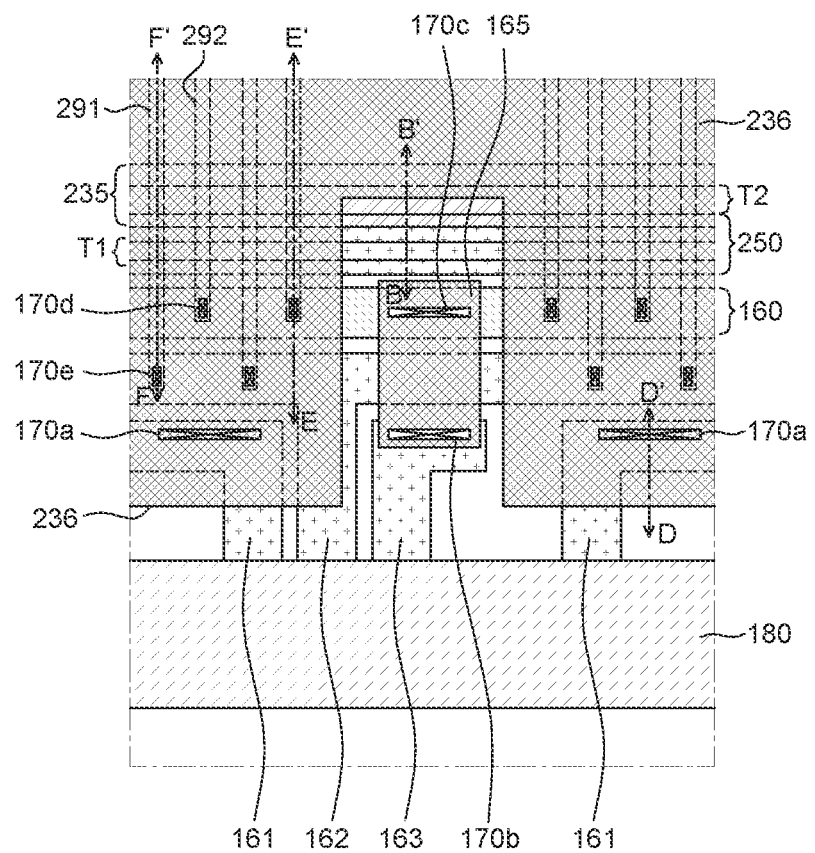
FIG. 7B is a top plan view illustrating enlarged part B of the display panel illustrated in FIG. 6 according to an embodiment of the present disclosure.

FIG. 7B is a top plan view illustrating enlarged part B of the display panel illustrated in FIG. 6.

Figure 8A:
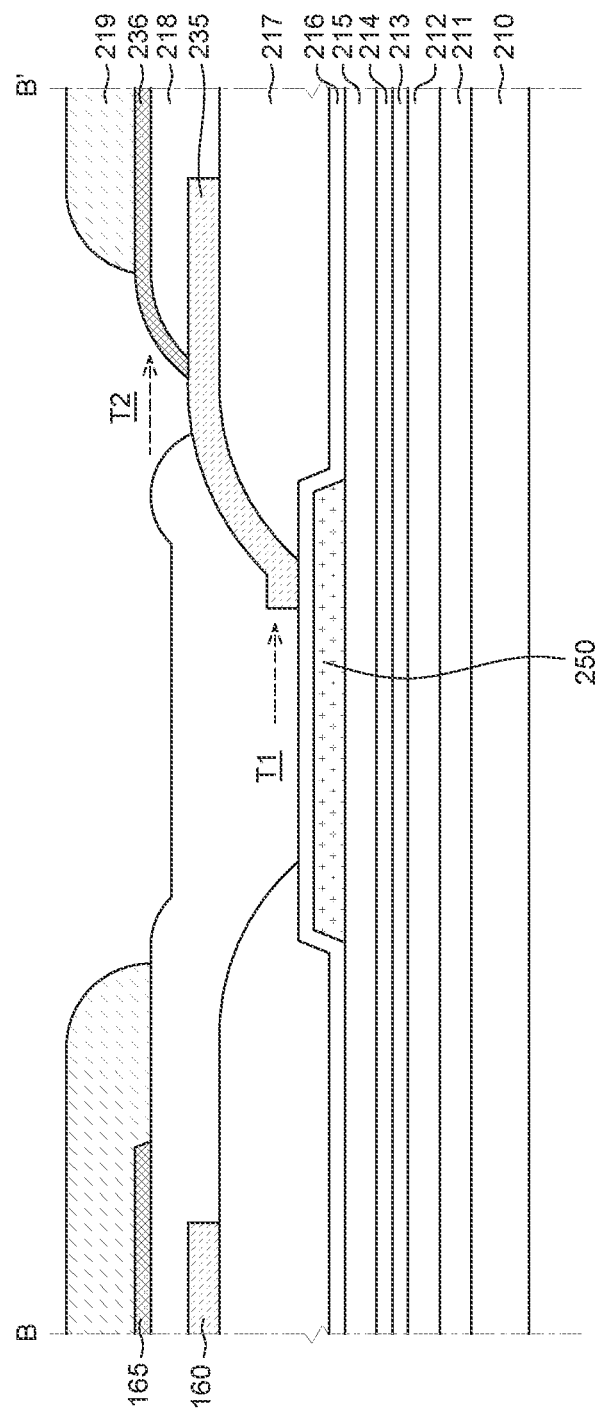
FIG. 8A is a cross-sectional view taken along line B-B' in FIG. 7B according to an embodiment of the present disclosure.

FIG. 8A is a cross-sectional view taken along line B-B' in FIG. 7B.

Figure 8B:
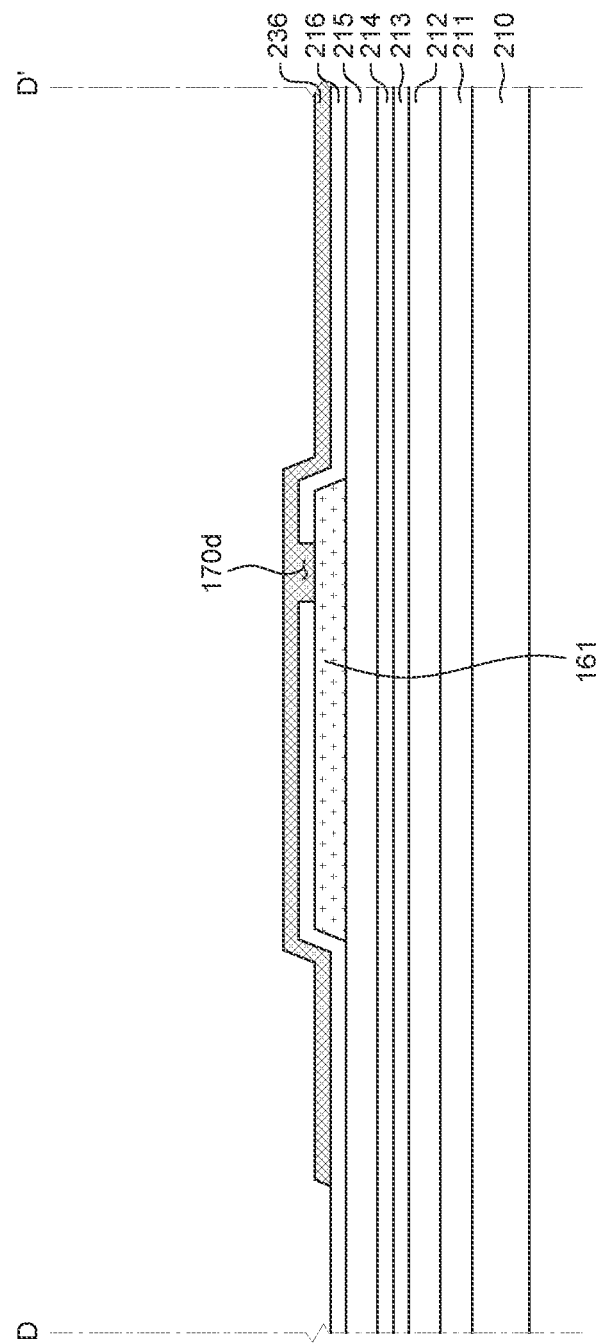
FIG. 8B is a cross-sectional view taken along line D-D' in FIG. 7B according to an embodiment of the present disclosure.

FIG. 8B is a cross-sectional view taken along line D-D' in FIG. 7B.

Figure 8C:
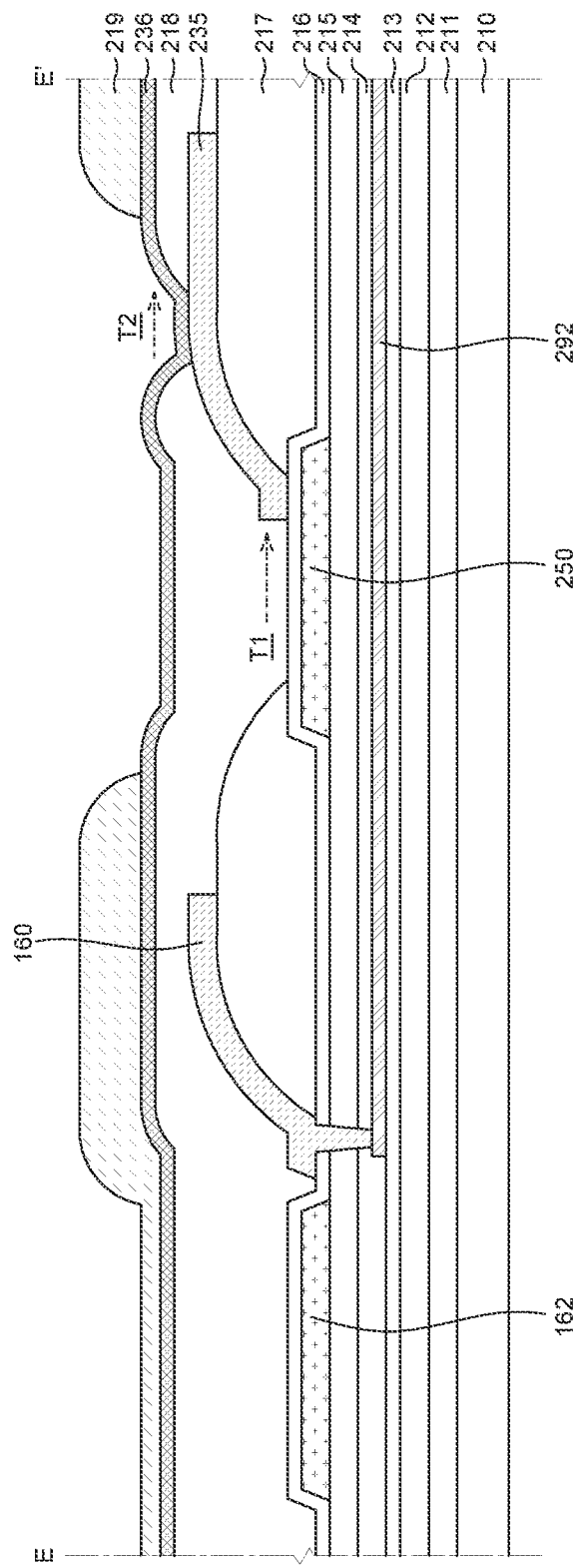
FIG. 8C is a cross-sectional view taken along line E-E' in FIG. 7B according to an embodiment of the present disclosure.

FIG. 8C is a cross-sectional view taken along line E-E' in FIG. 7B.

Figure 8D:
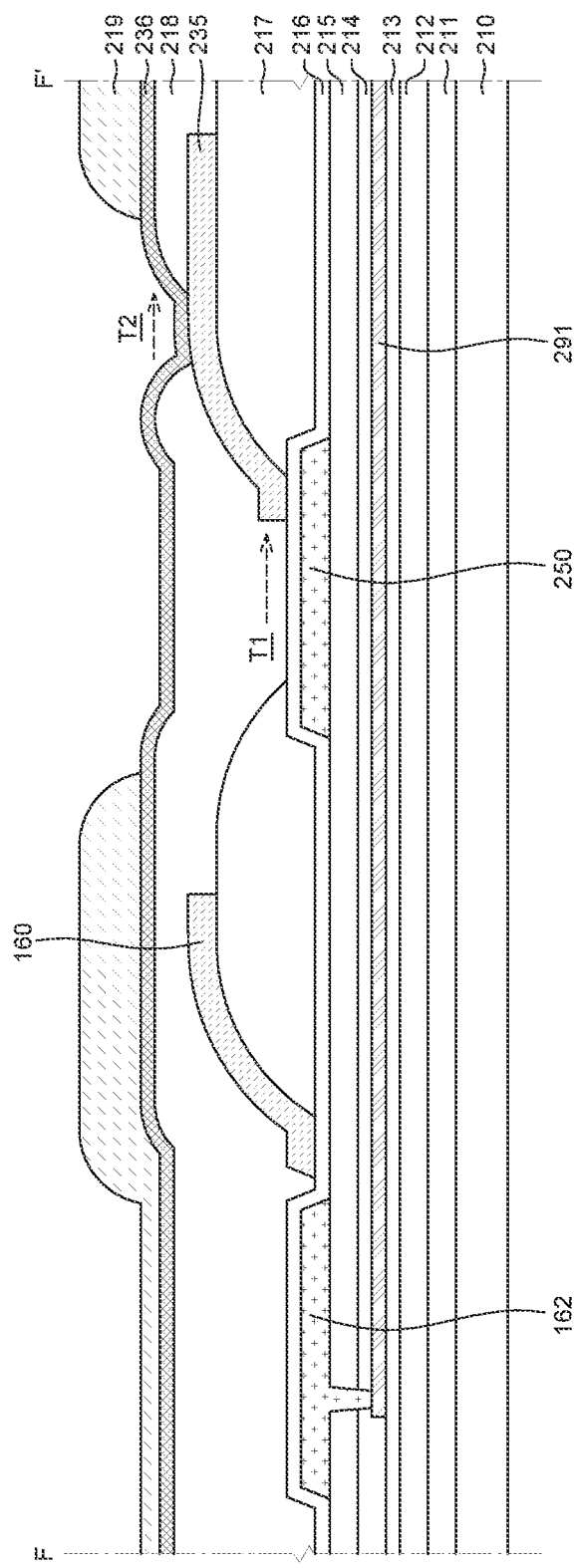
FIG. 8D is a cross-sectional view taken along line F-F' in FIG. 7B according to an embodiment of the present disclosure.

FIG. 8D is a cross-sectional view taken along line F-F' in FIG. 7B.

With reference to FIGS. 6, 7A, 7B, 8A, 8B, 8C, and 8D, in the second embodiment of the present disclosure, second and third layers 235 and 236 are disposed to cover lateral surfaces of third upper and lower insulating layers 217 and 218 in first and second holes T1 and T2 (e.g., a type of double trench or stacked trenches). For example, the first and second holes T1 and T2 can form two continuous and unbroken trenches that extend all the way around the display area DA for protecting against moisture penetration.

FIG. 7A illustrates a part of a cross-sectional structure of a single subpixel of the display panel PN illustrated in FIG. 6. FIG. 7B illustrates enlarged part A of the non-display area NDA on which the source drive IC is positioned.

With reference to FIGS. 6, 7A, 7B, 8A, 8B, 8C, and 8D, the display apparatus according to the second embodiment of the present disclosure can include a substrate 210, a fifth transistor T5, a light emitting element 220, the third upper and lower insulating layers 217 and 218, and a bank 219.

For convenience of description, FIG. 7A illustrates only the fifth transistor T5 among the plurality of transistors T1, T2, T3, T4, T5, and T6 and the capacitor Cst of the pixel circuit of the subpixel SP illustrated in FIG. 2. However, embodiments of the present disclosure are not limited thereto.

The display panel PN can be divided into the display area DA in which the subpixels are disposed to display images, and the non-display area NDA that displays no image. In the display area DA, the plurality of gate lines, the data lines, and the subpixels can be disposed. In the non-display area NDA, the gate driving part, the data driving part, and the plurality of pads can be disposed. However, embodiments of the present disclosure are not limited thereto.

The gate driving part can be provided in the GIP (Gate Driver In Panel) manner and disposed at the non-display area DA at one side or both sides of the display panel PN. Alternately, the gate driving part can be manufactured in the form of a driving chip and mounted on a flexible film. The gate driving part can be attached, in the TAB (Tape Automated Bonding) manner, to the non-display area DA of the display panel PN. In addition, in the situation in which the source drive IC is manufactured in the form of a driving chip, the data driving part can be mounted on a flexible film in the COF (Chip On Film) manner or the COP (Chip On Plastic) manner. Hereinafter, for convenience of description, the example in which the source drive IC is mounted on the flexible film 180 in the COF manner will be described, embodiments of but the present disclosure are not limited thereto.

Each of the plurality of subpixels is an individual unit configured to emit light, and the light emitting elements 220 can be disposed on the plurality of subpixels, respectively. The plurality of subpixels can include the first subpixel, the second subpixel, and the third subpixel that emit light beams with different colors. For example, the first subpixel can be a blue subpixel, the second subpixel can be a green subpixel, and the third subpixel can be a red subpixel. However, embodiments of the present disclosure are not limited thereto.

The plurality of subpixels can be defined (or divided) by the bank 219. For example, in the subpixel, the bank 219 can be disposed to partially cover the third upper and lower insulating layers 217 and 218 and a first electrode 221 of the light emitting element 220. The substrate 210 can include a light emitting region and a non-light emitting region. For example, in the non-light emitting region, the bank 219 can be disposed on the first electrode 221 to inhibit or prevent light from being created in the non-light emitting region. In contrast, because the bank 219 is not disposed at the light emitting region, an organic layer 222 can be disposed directly on the first electrode 221, such that light can be created by the organic layer 222.

A plurality of spacers 240 can be disposed between the plurality of subpixels. A fine metal mask (FMM), which is a deposition mask, can be used to form the light emitting elements 220 on the plurality of subpixels. In this situation, the plurality of spacers 240 can be disposed between the plurality of subpixels in order to inhibit or prevent damage caused by contact with the deposition mask and maintain a constant distance between the deposition mask and the substrate 210.

The plurality of subpixels for displaying images is disposed at the display area DA. Each of the subpixels can include the light emitting element 220 having at least one transistor T5, the first electrode 221, the organic layer 222, and a second electrode 223. In this situation, when the gate signal is inputted from the gate line, each of the subpixels uses the transistor T5 to supply a predetermined current to the light emitting element 220 based on the data voltage of the data line. Therefore, the light emitting element 220 of each of the transistors T5 can emit light with predetermined brightness based on the predetermined current.

The substrate 210 is a support member for supporting other components of the display apparatus and can be formed of an insulating material. For example, the substrate 210 can be formed of glass, resin, or the like. In addition, the substrate 210 can include plastic such as polymer or polyimide (PI) and can be formed of a material having flexibility.

A first buffer layer 211 can be disposed on the substrate 210. The first buffer layer 211 can reduce permeation of moisture or impurities through the substrate 210. For example, the first buffer layer 211 can have a single layer or a plurality of layers formed of silicon oxide (SiOx) or silicon nitride (SiNx), but embodiments of the present disclosure are not limited thereto. However, the first buffer layer 211 can be omitted in accordance with the type of substrate 210 or the type of transistor, but embodiments of the present disclosure are not limited thereto.

A second buffer layer 212 can be disposed on the first buffer layer 211.

The second buffer layer 212 can be provided to inhibit or prevent elution of alkaline materials in the substrate 210 which can be produced during the subsequent process such as crystallization of the active layer ACT.

For example, the second buffer layer 212 can have a single layer or a plurality of layers formed of silicon oxide (SiOx) or silicon nitride (SiNx), but embodiments of the present disclosure are not limited thereto.

The fifth transistor T5 can be disposed on the second buffer layer 212.

The fifth transistor T5 can include the active layer ACT, the gate electrode GE, the source electrode SE, and the drain electrode DE.

The active layer ACT can be formed of a semiconductor material such as an oxide semiconductor, amorphous silicon, or polysilicon, but embodiments of the present disclosure are not limited thereto. For example, in the situation in which the active layer ACT is formed of oxide semiconductor, the active layer ACT can include the channel region, the source region, and the drain region, and the source region and the drain region can be regions having conductivity, but embodiments of the present disclosure are not limited thereto.

In addition, a first active layer ACT1 can be disposed on the second buffer layer 212. However, the first active layer ACT1 can be omitted.

A first insulating layer 213 can be disposed on the active layer ACT. The first insulating layer 213 can be a gate insulating layer, but embodiments of the present disclosure are not limited thereto.

The first insulating layer 213 is an insulating layer for insulating the active layer ACT and the gate electrode GE.

The first insulating layer 213 can have a single layer or a plurality of layers formed of silicon oxide (SiOx) or silicon nitride (SiNx), but embodiments of the present disclosure are not limited thereto.

The gate electrode GE can be disposed on the first insulating layer 213.

In this situation, the gate electrode GE can be formed of an electrically conductive material, for example, copper (Cu), aluminum (Al), molybdenum (Mo), nickel (Ni), titanium (Ti), chromium (Cr), or an alloy thereof, but embodiments of the present disclosure are not limited thereto.

In addition, a first gate electrode GE1 can be disposed on the first insulating layer 213. The first gate electrode GE1 can be disposed at an upper side of the first active layer ACT1. However, the first gate electrode GE1 can be omitted.

The plurality of power lines can be disposed on the first insulating layer 213 from the non-display area NDA to the display area DA. FIG. 7B illustrates a high-potential power line 291 and a reference voltage line 292 as examples of the power lines, but embodiments of the present disclosure are not limited thereto. The high-potential power line 291 and the reference voltage line 292 can be disposed on the same layer as the gate electrode GE and formed of the same electrically conductive material as the gate electrode GE, but embodiments of the present disclosure are not limited thereto.

A first interlayer insulating layer 214 can be disposed on the gate electrode GE, the high-potential power line 291, and the reference voltage line 292.

A second interlayer insulating layer 215 can be disposed on the first interlayer insulating layer 214. However, the second interlayer insulating layer 215 can be omitted, but embodiments of the present disclosure are not limited thereto.

In addition, a conductive layer TM1 can be disposed on the first interlayer insulating layer 214. The conductive layer TM1 can be disposed at an upper side of the first gate electrode GE1. However, the conductive layer TM1 can be omitted in accordance with embodiments of the present disclosure.

An active contact holes for connecting the source electrode SE and the drain electrode DE to the source region and the drain region of the active layer ACT can be formed in the first insulating layer 213, the first interlayer insulating layer 214, and the second interlayer insulating layer 215.

In addition, the fifth contact hole 170e for connecting the second link line 162 to the high-potential power line 291 can be formed in the first interlayer insulating layer 214 and the second interlayer insulating layer 215.

Each of the first interlayer insulating layer 214 and the second interlayer insulating layer 215 can have a single layer or a plurality of layers formed of silicon oxide (SiOx) or silicon nitride (SiNx), but embodiments of the present disclosure are not limited thereto.

The source electrode SE and the drain electrode DE can be disposed on the second interlayer insulating layer 215. The source electrode SE and the drain electrode DE disposed to be spaced apart from each other can be electrically connected to the active layer ACT through the contact hole. Each of the source electrode SE and the drain electrode DE can be formed of an electrically conductive material, for example, copper (Cu), aluminum (Al), molybdenum (Mo), nickel (Ni), titanium (Ti), chromium (Cr), or an alloy thereof, but embodiments of the present disclosure are not limited thereto.

A data line can be disposed on the second interlayer insulating layer 215. For example, the data line can be disposed on the same layer as the source electrode SE and the drain electrode DE and can be formed of the same electrically conductive material as the source electrode SE and the drain electrode DE, but embodiments of the present disclosure are not limited thereto.

In addition, a first source/drain electrode SDI can be disposed on the second interlayer insulating layer 215. The first source/drain electrode SDI can be disposed at an upper side of the conductive layer TM1. However, the first source/drain electrode SDI can be omitted.

In addition, in the non-display area NDA, the plurality of link lines 161, 162, and 163 can be disposed on the second interlayer insulating layer 215. As an example, FIG. 7B illustrates that the link lines 161, 162, and 163 include the first link line 161 for transmitting a low-potential voltage, the second link line 162 for transmitting a high-potential voltage, and the third link line 163 for transmitting a reference voltage, but embodiments of the present disclosure are not limited thereto.

A second insulating layer 216 can be disposed on the link lines 161, 162, and 163, the data line, the source electrode SE, and the drain electrode DE. The second insulating layer 216 can be a protective layer, but embodiments of the present disclosure are not limited thereto. The second insulating layer 216 can be an insulating layer for protecting components disposed under the second insulating layer 216. For example, the second insulating layer 216 can have a single layer or a plurality of layers formed of silicon oxide (SiOx) or silicon nitride (SiNx), but embodiments of the present disclosure are not limited thereto. In addition, the second insulating layer 216 can be omitted in accordance with embodiments of the present disclosure.

The fourth contact hole 170d for connecting the reference voltage electrode 160 to the reference voltage line 292 can be formed in the first interlayer insulating layer 214, the second interlayer insulating layer 215, and the second insulating layer 216.

In addition, the first contact hole 170a for connecting the third layer 236 to the first link line 161 can be formed in the second insulating layer 216.

The third lower insulating layer 217 can be disposed on the second insulating layer 216. The third lower insulating layer 217 can be a first planarization layer, but embodiments of the present disclosure are not limited thereto. The third lower insulating layer 217 can be omitted in accordance with embodiments of the present disclosure.

The third lower insulating layer 217 can be an insulating layer for planarizing an upper portion of the substrate 210. The third lower insulating layer 217 can be formed of an organic material. For example, the third lower insulating layer 217 can have a single layer or a plurality of layers formed of polyimide or photo acryl, but embodiments of the present disclosure are not limited thereto.

The drain contact hole for connecting the first electrode 221 to the drain electrode DE can be formed in the second insulating layer 216 and the third lower insulating layer 217.

The connection electrode CE can be disposed on the third lower insulating layer 217, but embodiments of the present disclosure are not limited thereto. In addition, the connection electrode CE can be omitted in accordance with embodiments of the present disclosure.

The connection electrode CE can be electrically connected to the drain electrode DE through the contact hole. The connection electrode CE can be formed of an electrically conductive material, for example, copper (Cu), aluminum (Al), molybdenum (Mo), nickel (Ni), titanium (Ti), chromium (Cr), or an alloy thereof, but embodiments of the present disclosure are not limited thereto. For example, the connection electrode CE can be a second drain electrode.

In the non-display area NDA, the reference voltage electrode 160 and the second layer 235 can be disposed on the third lower insulating layer 217. The reference voltage electrode 160 and the second layer 235 can be formed on the same layer as the connection electrode CE and formed of the same material as the connection electrode CE. However, embodiments of the present disclosure are not limited thereto.

The third upper insulating layer 218 can be disposed on the connection electrode CE. The third upper insulating layer 218 can be a second planarization layer. However, embodiments of the present disclosure are not limited thereto, and the third upper insulating layer 218 can be omitted in accordance with embodiments of the present disclosure.

The third upper insulating layer 218 can be an insulating layer for planarizing the upper portion of the substrate 210. The third upper insulating layer 218 can be formed of an organic material. For example, the third upper insulating layer 218 can have a single layer or a plurality of layers formed of polyimide or photo acryl, but embodiments of the present disclosure are not limited thereto.

The light emitting elements 220 can be disposed on the subpixels on the third upper insulating layer 218, respectively. The light emitting element 220 can include the first electrode 221, the organic layer 222, and the second electrode 223. The organic layer 222 can include a light emitting layer 222a disposed at the light emitting region, and a common layer 222c disposed on the entire surface of the substrate 210 including the light emitting region.

The first electrode 221, which is the anode electrode, can be disposed on the third upper insulating layer 218.

The first electrode 221 can be electrically connected to the fifth transistor T5 and supplied with the drive current of the pixel circuit. In this situation, because the first electrode 221 supplies holes to the light emitting layer 222a, the first electrode 121 can be formed of an electrically conductive material having a high work function. For example, the first electrode 221 can be formed of an electrically conductive transparent material such as indium tin oxide (ITO) or indium zinc oxide (IZO), but embodiments of the present disclosure are not limited thereto.

The display apparatus can be implemented in a top emission manner or a bottom emission manner. In the situation of the top emission type display apparatus, the reflective layer, which is formed of a metal material, for example, aluminum (Al) or silver (Ag) excellent in reflection efficiency, can be additionally provided at a lower side of the first electrode 221 so that the light emitted from the light emitting layer 222a is reflected by the first electrode 221 and then directed upward, for example, toward the second electrode 223. In the situation of the bottom emission type display apparatus, the first electrode 221 can be formed of only an electrically conductive transparent material. Hereinafter, the description will be made on the assumption that the display apparatus according to the second embodiment of the present disclosure is the top emission type display apparatus.

The first electrode 221 can have a layered structure having two or more layers including the reflective layer.

In the non-display area NDA, the connection electrode 165 and the third layer 236 can be disposed on the third upper insulating layer 218. The connection electrode 165 and the third layer 236 can be formed on the same layer as the first electrode 221 and formed of the same material as the first electrode 221. However, embodiments of the present disclosure are not limited thereto.

The connection electrode 165 can be connected to the third link line 163 through the second contact hole 170b. In addition, the connection electrode 165 can be connected to the reference voltage electrode 160 through the third contact hole 170c. Therefore, the reference voltage can be transmitted to the reference voltage line 292 through the connection electrode 165 and the reference voltage electrode 160.

The connection electrode 165 can be separated from the third layer 236 and disposed at the region from which a part of the third layer 236 on which the third link line 163 is positioned is removed.

The third layer 236 extends to the display area DA and can be connected to the second electrode 123 through the predetermined contact hole.

Meanwhile, a first hole T1 can be formed in the non-display area NDA at the periphery of the display area DA. The first hole T1 (e.g., a first trench/moat) is formed by removing the third lower insulating layer 217 and divides the third lower insulating layer 217 into two portions.

The first hole T1 can be disposed at the non-display area NDA so as to surround an edge or a periphery of the display area DA. Therefore, in the non-display area NDA, the first hole T1 divides the third lower insulating layer 217 into the two portions, for example, divides the third insulating layer 217 into inner and outer portions. As a result, it is possible to inhibit or prevent outside moisture from permeating into the display area DA through the third lower insulating layer 217. In this situation, for convenience of description, the inner portion of the non-display area NDA can be the non-display area NDA at a position close to the display area DA based on the first hole T1, and the outer portion of the non-display area NDA can be the non-display area NDA at a position relatively distant from the display area DA based on the first hole T1.

A first layer 250 can be further disposed under the first hole T1, thereby minimizing or reducing the permeation of moisture into the display area DA. The first layer 250 can be a moisture permeation inhibiting layer or a moisture permeation preventing layer, but embodiments of the present disclosure are not limited by the term.

The first layer 250 can have a wider width than the first hole T1, but embodiments of the present disclosure are not limited thereto.

The first layer 250 can be disposed on the second interlayer insulating layer 215 under the first hole T1, and the second insulating layer 216 can be disposed on the first layer 250. For example, in a situation in which the second insulating layer 216 is omitted, the third lower insulating layer 217 can be disposed on the first layer 250.

The first layer 250 can be disposed on the same layer as the source electrode SE and the drain electrode DE of the display area DA, and the first layer 250 can be formed of the same material as the source electrode SE and the drain electrode DE. The first layer 250 can be formed of an electrically conductive material, for example, copper (Cu), aluminum (Al), molybdenum (Mo), nickel (Ni), titanium (Ti), chromium (Cr), or an alloy thereof, but embodiments of the present disclosure are not limited thereto.

According to the second embodiment of the present disclosure, the first hole T1 can be formed in the non-display area NDA by removing the third lower insulating layer 217, such that the second insulating layer 216 under the first hole T1 can be exposed. An upper surface of the second insulating layer 216, which is exposed through the first hole T1, can be covered by the third upper insulating layer 218.

A lateral surface of the third lower insulating layer 217 at a position close to the display area DA based on the first hole T1, that is, inside the first hole T1 is also exposed through the first hole T1. In the second embodiment of the present disclosure, the second layer 235 is disposed to cover the exposed lateral surface of the third lower insulating layer 217 disposed at the inside.

According to the second embodiment of the present disclosure, the second layer 235 can be disposed to cover the exposed lateral surface of the third lower insulating layer 217, disposed at the inside, from the upper surface of the third lower insulating layer 217 (e.g., the second layer 235 can provide a type of sealing function for blocking moisture).

In addition, a part of the third upper insulating layer 218, for example, the third upper insulating layer 218 disposed at the outside can be disposed to cover the lateral surface and a part of the upper surface of the second layer 235. Another part of the third upper insulating layer 218, for example, the third upper insulating layer 218 disposed at the inside can be disposed to cover another part of the upper surface of the second layer 235. For example, the third upper insulating layer 218 can be disposed on the entire surface of the substrate 210 except for a part of the upper surface of the second layer 235 formed by the second hole T2. The part of the third upper insulating layer 218 is a part positioned outside the non-display area NDA and can be disposed to cover the first hole T1, the lateral surface and a part of the upper surface of the second layer 235. Further, another part of the third upper insulating layer 218 is a part positioned inside the non-display area NDA and can be disposed to cover another part of the upper surface of the second layer 235.

The second hole T2 can be disposed at the non-display area NDA so as to surround an edge or a periphery of the display area DA (e.g., the first and second holes T1, T2 can form back-to-back trenches or a type of double moat).

The second hole T2 can be disposed between the first hole T1 and the display area DA so as to surround the edge or the periphery of the display area DA. Therefore, the second hole T2 can separate or isolate the third upper insulating layer 218 from the third upper insulating layer 212 in the display area DA and the third upper insulating layer 212 in the non-display area NDA.

The second layer 235 can be disposed on the same layer as the connection electrode CE of the display area DA, and the second layer 235 can be formed of the same material as the connection electrode CE. Therefore, the second layer 235 can be formed of an electrically conductive material, for example, copper (Cu), aluminum (Al), molybdenum (Mo), nickel (Ni), titanium (Ti), chromium (Cr), or an alloy thereof, but embodiments of the present disclosure are not limited thereto.

In addition, according to the second embodiment of the present disclosure, the third layer 236 is disposed to cover a lateral surface of another part of the third upper insulating layer 218. For example, the lateral surface and a part of the upper surface another part of the third upper insulating layer 218 can be covered by the third layer 236. The third layer 236 can extend to the upper surface of the second layer 235 to cover the lateral surface of another part of the third upper insulating layer 218 from the upper surface of another part of the third upper insulating layer 218. Therefore, one end or one portion of the third layer 236 can adjoin the upper surface of the second layer 235.

In addition, the lateral surface and a part of the upper surface of the third upper insulating layer 218 in the non-display area NDA can be covered by the third layer 236.

The third layer 236 can be disposed on the same layer as the first electrode 221 of the display area DA, and the third layer 236 can be formed of the same material as the first electrode 221. Therefore, the third electrode 236 can be formed of an electrically conductive transparent material such as indium tin oxide (ITO) or indium zinc oxide (IZO), but embodiments of the present disclosure are not limited thereto. In the situation of the top emission type display apparatus, the third layer 236 can further include a reflective layer formed of a material such as aluminum (Al) or silver (Ag).

The second and third layers 235 and 236 can be formed at the edges or peripheries of the first and second holes T1 and T2, respectively, so as to partially cover the lateral surfaces of the third upper and lower insulating layers 217 and 218. The second and third layers 235 and 236 can be configured such that the third layer 236 is disposed on the second layer 235 in a stepwise manner (e.g., the second layer 235 and the third layer 236 can form overlapping seals or moisture barriers for the sides of the insulating layers).

Therefore, according to the second embodiment of the present disclosure, the first and second holes T1 and T2 can be formed between the display area DA and the non-display area NDA, thereby dividing the third upper and lower insulating layers 217 and 218 into the third upper and lower insulating layers 217 and 218 in the display area DA and the third upper and lower insulating layers 217 and 218 in the non-display area NDA. Further, the first layer 250 can be formed under the first hole T1.

In addition, according to the second embodiment of the present disclosure, the second and third layers 235 and 236 can be formed in a stepwise manner at the edges or peripheries of the first and second holes T1 and T2 so as to cover the third upper and lower insulating layers 217 and 218, thereby minimizing or reducing the permeation of moisture from the outside (see the arrows illustrated in FIG. 8A). Therefore, it is possible to ensure reliability of the display apparatus and ensure a lifespan of a product. In this situation, the second and third layers 235 and 236 can be formed of different metal materials, and this configuration can be more effective in blocking the moisture. In addition, the second and third layers 235 and 236 can be partially disposed in a stepwise manner, thereby compensating for a level difference. The stepped portion formed in a stepwise manner can increase overall widths of the first and second holes T1 and T2, which can be more effective in blocking the moisture.

In addition, the moisture permeation inhibiting structure according to the present disclosure can inhibit or prevent the permeation of moisture without changing a mask and a process, thereby providing an effect of improving process properties.

As described above, the light emitting element 220 can include the first electrode 221, the organic layer 222, and the second electrode 223.

The organic layer 222 can be disposed between the first electrode 221 and the second electrode 223.

The organic layer 222 can refer to a region in which the light is emitted as electrons and holes supplied from the first electrode 221 and the second electrode 223 are combined.

According to the second embodiment of the present disclosure, the organic layer 222 can include the light emitting layers 222a disposed on the plurality of subpixels, respectively, and the common layer 222c disposed in common on the plurality of subpixels.

In order to improve quality and productivity of the electroluminescent display apparatus, there have been proposed structures of various light emitting elements 220 for improving efficiency of the light emitting element 220, increasing the lifespan, and reducing the power consumption.

Therefore, there has been proposed the structure of the light emitting element 220 to which a single stack, for example, a single light emitting unit or a single light emitting part (an electroluminescence (EL) unit or an EL portion) is applied. Further, there also has been proposed the light emitting element 220 having a tandem structure that uses a plurality of stacks, for example, a stack of a plurality of light emitting units (or light emitting parts) in order to implement improved efficiency and lifespan properties.

In the situation of the tandem structure, for example, the light emitting element 220 having a two-stack structure using a stack of a first light emitting unit (or a first stack) and a second light emitting unit (or a second stack), the light emitting regions in which light is emitted by recombination of electrons and holes are positioned in the first stack and the second stack, respectively. As a result, the light emitted from the first light emitting layer in the first stack and the light emitted from the second light emitting layer in the second stack can generate reinforcement interference, thereby providing higher brightness in comparison with a light emitting element having a single stack structure.

For example, the stack structure can include a charge generating layer disposed between the first electrode 231 and the second electrode 233, the first stack disposed between the charge generating layer and the second electrode 233, and the second stack disposed between the first electrode 231 and the charge generating layer. The charge generating layer can be disposed between the first stack and the second stack and can generate electric charges. The charge generating layer can have a structure in which a p-type charge generating layer and an n-type charge generating layer are laminated. For example, the charge generating layer can have the p-type charge generating layer and the n-type charge generating layer that generate positive electric charges and negative electric charges in two directions. The charge generating layer can substantially serve as an electrode.

Each of the first stack and the second stack can include one or more light emitting layers 222a, and common layers 222c disposed at upper and lower sides of the light emitting layer 222a with the light emitting layer 222a interposed therebetween.

For reference, in the light emitting element 220, a distance between the plurality of subpixels constituting one pixel decreases as the electroluminescent display apparatus has high resolution. Except for the light emitting layer (emission layer (EML)) 222a, auxiliary organic layers, such as the hole injecting layer (EIL), the hole transporting layer (HTL), the charge generating layer (CGL), the electron injecting layer (EIL) and the electron transporting layer (ETL), are formed in the common layer 222c by deposition using a common mask so as to correspond to all the plurality of subpixels. The light emitting layers 222a in the plurality of subpixels for generating light beams with different wavelengths can be individually formed by deposition using a fine metal mask so as to correspond to the respective subpixels. However, embodiments of the present disclosure are not limited thereto.

The bank 219 can be disposed on the first electrode 221 and the third upper insulating layer 218. The bank 219 is an insulating layer disposed between the plurality of subpixels to divide the plurality of subpixels.

The bank 219 can include an opening portion through which a part of the first electrode 221 is exposed. The bank 219 can be formed of an organic insulating material and disposed to cover an edge (or a periphery) or an edge portion of the first electrode 221. For example, the bank 219 can be formed of polyimide, acryl, or benzocyclobutene (BCB)-based resin, but embodiments of the present disclosure are not limited thereto.

According to the second embodiment of the present disclosure, the bank 219 may not be disposed between the display area DA and the non-display area NDA. For example, the bank 219 can be divided with the display area DA and the non-display area NDA interposed therebetween. One part of the bank 219 can be disposed to cover the upper surface of the second layer 235 in the display area DA, and another part of the bank 219 can be disposed to cover the upper surface of the third upper insulating layer 218 in the non-display area NDA. In this situation, a part of the upper surface and the lateral surface of the second layer 235 in the display area DA can be exposed, and a part of the upper surface and the lateral surface of the third upper insulating layer 218 in the non-display area NDA can be exposed. However, embodiments of the present disclosure are not limited thereto.

The plurality of spacers 240 can be disposed on the bank 219. The spacer 240 can be disposed on the bank 219 in order to maintain a predetermined distance from the deposition mask at the time of forming the light emitting element 220. The spacer 240 can maintain a predetermined distance between the deposition mask and the bank 219 under the spacer 240 and between the first electrode 221 and the deposition mask, thereby inhibiting or preventing damage caused by contact. The plurality of spacers 240 can have a width gradually decreasing upward, for example, have a tapered shape to minimize or reduce an area to be in contact with the deposition mask. However, embodiments of the present disclosure are not limited thereto.

The organic layer 222 can be disposed on the first electrode 221 and the bank 219.

The organic layer 222 can include the light emitting layers 222a disposed on the plurality of subpixels, respectively, and the common layer 222c disposed in common on the plurality of subpixels. The light emitting layer 222a is an organic layer for emitting light with a specific color, and the different light emitting layers 222a can be disposed on the first subpixel, the second subpixel, and the third subpixel, respectively. However, embodiments of the present disclosure are not limited thereto. The plurality of light emitting layer 222a can be disposed on all the subpixels, respectively, to emit white light.

The common layer 222c is an organic layer disposed to improve luminous efficiency of the light emitting layer 222a. The common layer 222c can be a single layer formed over the plurality of subpixels. For example, the common layer 222c can be integrally formed by connecting the common layers 222c disposed on the plurality of subpixels, respectively. The common layer 222c can include the hole injecting layer, the hole blocking layer, the hole transporting layer, the electron transporting layer, the electron injecting layer, the electron blocking layer, the charge generating layer, and the like, but embodiments of the present disclosure are not limited thereto.

The second electrode 223 can be disposed on the organic layer 222.

Because the second electrode 223 supplies the electrons to the organic layer 222, the second electrode 223 can be formed of an electrically conductive material with a low work function. The second electrode 223 can be a single layer formed over the plurality of subpixels. For example, the second electrode 223 can be integrally formed by connecting the second electrodes 223 disposed on the plurality of subpixels, respectively. For example, the second electrode 223 can be formed of an electrically transparent conductive material such as indium tin oxide (ITO) or indium zinc oxide (IZO) or formed of an alloy of ytterbium (Yb). The second electrode 223 can further include a metal doping layer, but embodiments of the present disclosure are not limited thereto. In the situation of the bottom emission type display apparatus, the second electrode 223 can be formed of an opaque or semi-transparent metal material, and the color of the light generated by the organic layer 222 can be implemented by a color filter layer positioned under the organic layer 222.

In addition, the second electrode 223 can be electrically connected to the low-potential power line and supplied with the low-potential power signal.

An encapsulation part can be disposed on a second electrode 233. The encapsulation part can be disposed at an upper side the bank 219 and the light emitting element 220 to inhibit or prevent oxygen and moisture from permeating into the display apparatus from the outside.

The encapsulation part can include a first encapsulation layer, a second encapsulation layer, and a third encapsulation layer.

The first encapsulation layer can be disposed on the second electrode 233 to inhibit or prevent the permeation of moisture or oxygen. The first encapsulation layer can be formed of an inorganic material such as silicon nitride (SiNx), silicon oxynitride (SiNxOy), or aluminum oxide (AlyOz), but embodiments of the present disclosure are not limited thereto.

The second encapsulation layer can be disposed on the first encapsulation layer, and a surface of the second encapsulation layer can be planarized. In addition, the second encapsulation layer can cover foreign materials or particles that can be produced during the process of manufacturing the display apparatus. The second encapsulation layer can be formed of an organic material, for example, silicon oxycarbon (SiOxCz), or acrylic or epoxy-based resin, but embodiments of the present disclosure are not limited thereto.

The third encapsulation layer can be disposed on the second encapsulation layer to inhibit or prevent the permeation of moisture or oxygen together with the first encapsulation layer. The third encapsulation layer can be formed of an inorganic material such as silicon nitride (SiNx), silicon oxynitride (SiNxOy), silicon oxide (SiOx), or aluminum oxide (AlyOz), but embodiments of the present disclosure are not limited thereto.

According to the second embodiment of the present disclosure, the first and second holes T1 and T2 can be formed between the display area DA and the non-display area NDA, thereby dividing the third upper and lower insulating layers 217 and 218 into the third upper and lower insulating layers 217 and 218 in the display area DA and the third upper and lower insulating layers 217 and 218 in the non-display area NDA. Further, the first layer 250 can be formed under the first hole T1.

In addition, according to the second embodiment of the present disclosure, the second and third layers 235 and 236 can be formed in a stepwise manner at the edges or peripheries of the first and second holes T1 and T2 so as to cover the third upper and lower insulating layers 217 and 218, thereby minimizing or reducing the permeation of moisture from the outside. The second layer 235 can be a moisture permeation inhibiting layer or a moisture permeation preventing layer, but embodiments of the present disclosure are not limited by the term. The third layer 236 can be a moisture permeation inhibiting layer or a moisture permeation preventing layer, but embodiments of the present disclosure are not limited by the term.

In addition, the second layer 235 and the third layer 236 can be disposed on the same layer as the connection electrode CE and the first electrode 221 and formed of the same material as the connection electrode CE and the first electrode 221. The second layer 235 and the third layer 236 can be formed in a stepwise manner and thus can serve to compensate for a level difference at the periphery of the display area DA.

The second layer 235 can be electrically insulated (floating), but embodiments of the present disclosure are not limited thereto. The reference voltage can be applied to the third layer 236 through the first link line 161.

Figure 9A:
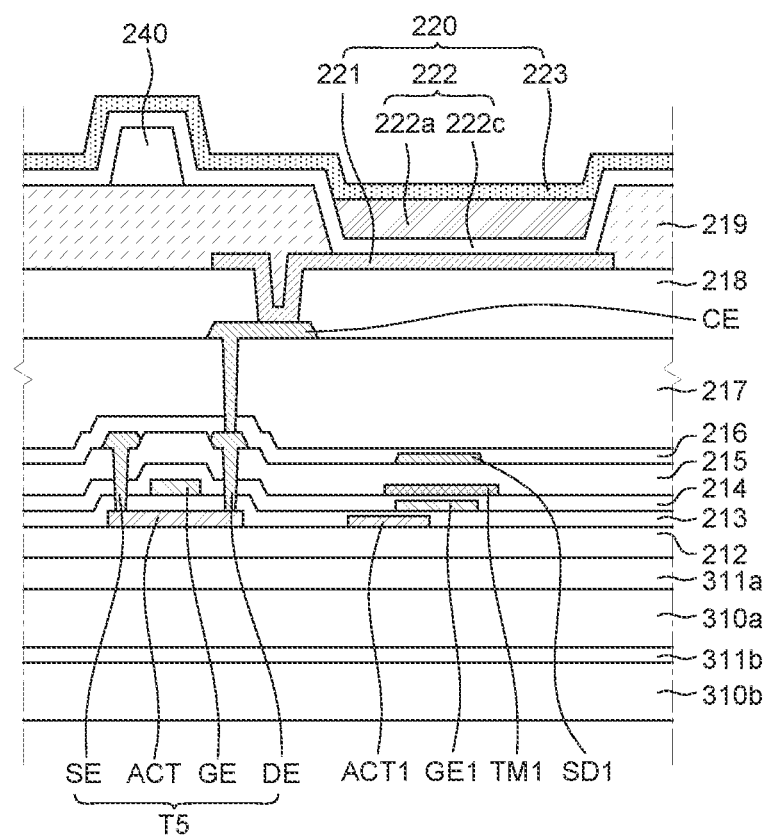
FIGS. 9A and 9B are views illustrating a part of a cross section of a display panel of a display apparatus according to another embodiment of the present disclosure.
Figure 9B:
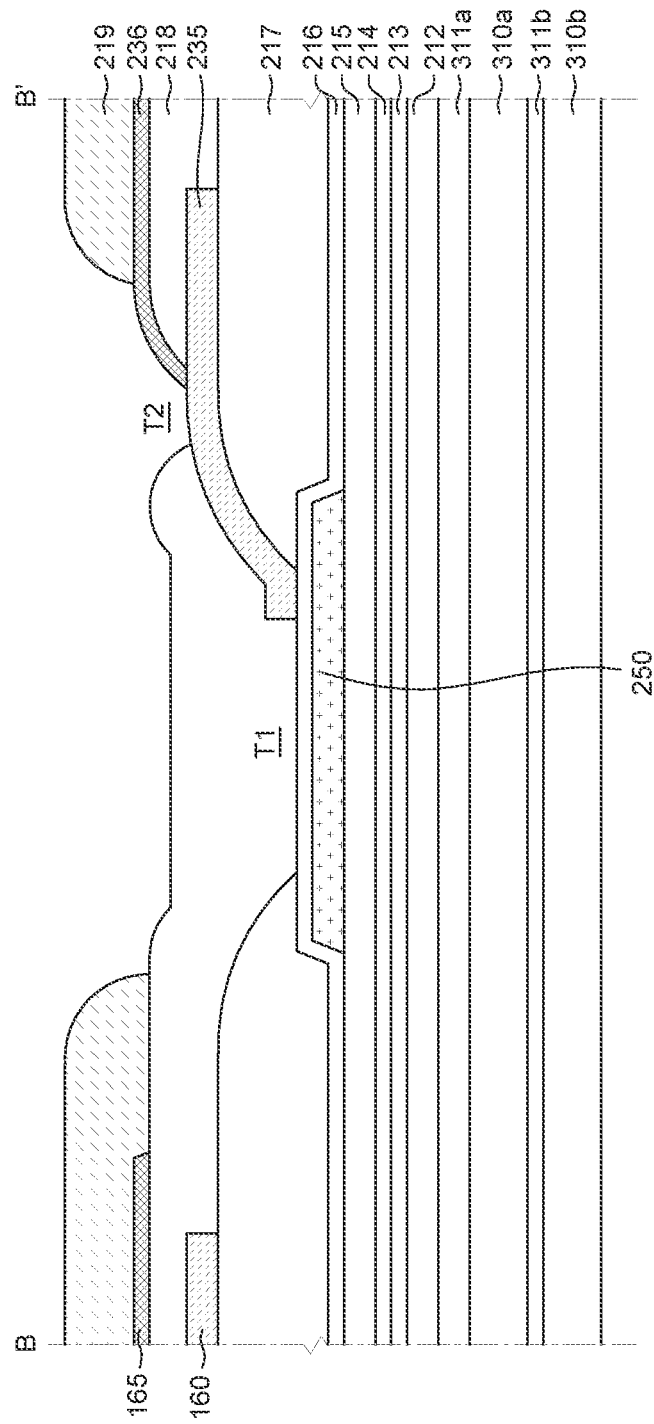

FIGS. 9A and 9B are views illustrating a part of a cross section of a display panel of a display apparatus according to a third embodiment of the present disclosure.

The display apparatus illustrated in FIGS. 9A and 9B is different from the display apparatus illustrated in FIGS. 7A and 7B in terms of a configuration of the substrate, and the other components of the two apparatuses are substantially identical (e.g., FIG. 9A shows a double layered substrate having multiple buffer layers). Therefore, the repetitive descriptions of the identical configurations will be omitted.

With reference to FIGS. 9A and 9B, the display apparatus according to the third embodiment of the present disclosure can include a first substrate 310a, a second substrate 310b, and a lower second buffer layer 311b provided between the first substrate 310a and the second substrate 310b.

The first substrate 310a and the second substrate 310b are support members for supporting other components of the display apparatus and can be formed of an insulating material. For example, the first substrate 310a and the second substrate 310b can include plastic such as polymer or polyimide (PI) and can be formed of a material having flexibility.

In addition, for example, the lower second buffer layer 311b can have a single layer or a plurality of layers formed of silicon oxide (SiOx) or silicon nitride (SiNx), but embodiments of the present disclosure are not limited thereto.

The layered structure including the first substrate 310a and the second substrate 310b can effectively inhibit or prevent the permeation of moisture and impurities.

An upper first buffer layer 311a can be disposed on the first substrate 310a.

The components provided above the upper first buffer layer 311a are substantially identical to those according to second embodiment of the present disclosure, and the repetitive description will be omitted.

Figure 10A:
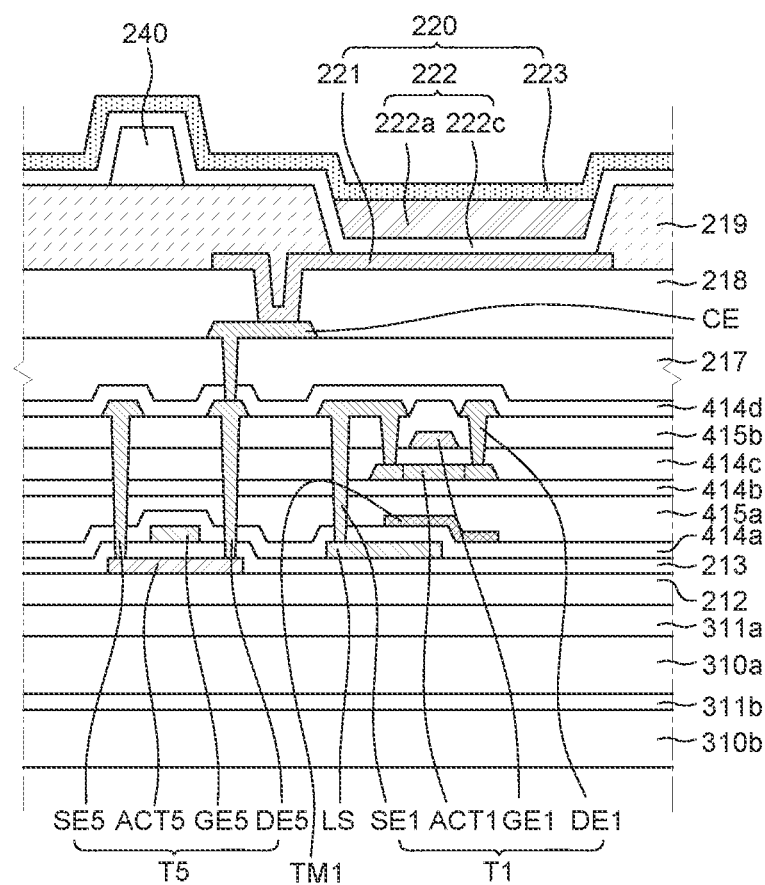
FIGS. 10A and 10B are views illustrating a part of a cross section of a display panel of a display apparatus according to another embodiment of the present disclosure.
Figure 10B:
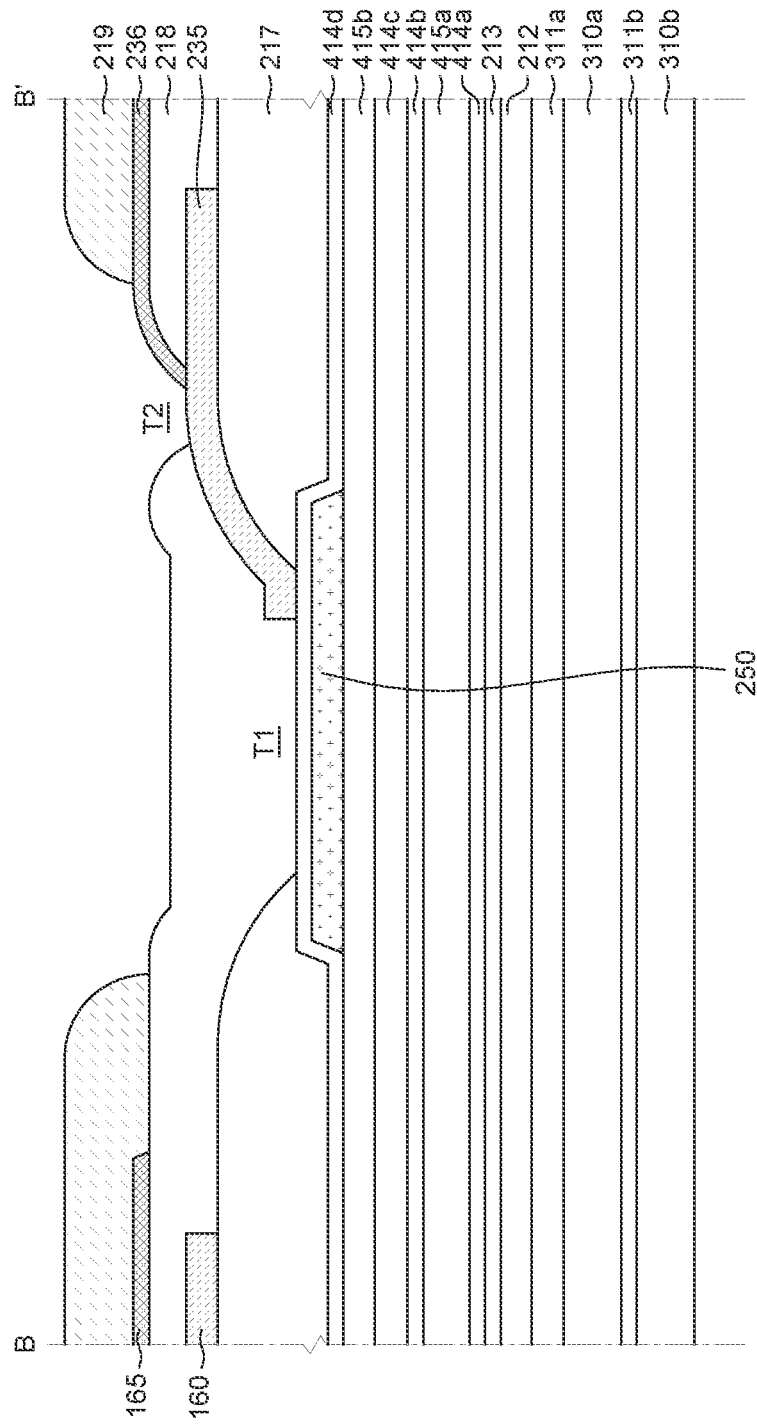

FIGS. 10A and 10B are views illustrating a part of a cross section of a display panel of a display apparatus according to a fourth embodiment of the present disclosure.

The display apparatus illustrated in FIGS. 10A and 10B is different from the display apparatus illustrated in FIGS. 9A and 9B in terms of a configuration of the transistor, and the other components of the two apparatuses are substantially identical. Therefore, the repetitive descriptions of the identical configurations will be omitted.

With reference to FIGS. 10A and 10B, the display apparatus according to the fourth embodiment of the present disclosure can include a first substrate 310a, a second substrate 310b, and a lower second buffer layer 311b provided between the first substrate 310a and the second substrate 310b.

An upper first buffer layer 311a can be disposed on the first substrate 310a.

The second buffer layer 212 can be disposed on the upper first buffer layer 311a.

The second buffer layer 212 can be provided to inhibit or prevent elution of alkaline materials in the first and second substrates 310a and 310b which can be produced during a process such as crystallization of a fifth active layer ACT5.

For example, the second buffer layer 212 can have a single layer or a plurality of layers formed of silicon oxide (SiOx) or silicon nitride (SiNx), but embodiments of the present disclosure are not limited thereto.

The first and fifth transistors T1 and T5 can be disposed on the second buffer layer 212.

The first transistor T1 can include a first active layer ACT1, a first gate electrode GE1, a first source electrode SE1, and a first drain electrode DE1.

The fifth transistor T5 can include a fifth active layer ACT5, a fifth gate electrode GE5, a fifth source electrode SE5, and a fifth drain electrode DE5.

The fifth active layer ACT5 can be disposed on the second buffer layer 212.

The fifth active layer ACT5 can be formed of a low-temperature polysilicon (LTPS). The polysilicon has high mobility, implements low energy power consumption, and has excellent reliability, and as a result, the polysilicon can be applied to the driving transistor and the like.

The first insulating layer 213 can be disposed on the fifth active layer ACT5.

The fifth gate electrode GE5 can be disposed on the first insulating layer 213.

In addition, a light blocking layer LS can be disposed on the first insulating layer 213.

The light blocking layer LS can be disposed to overlap the first active layer ACT1 of the first transistor T1. The light blocking layer LS can protect the first transistor T1 from light introduced from the outside or moisture introduced from the outside, thereby minimizing or reducing a change in element properties of the first transistor T1.

A first interlayer insulating layer 414a can be disposed on the fifth gate electrode GE5 and the light blocking layer LS.

A second interlayer insulating layer 415a can be disposed on the first interlayer insulating layer 414a. However, the second interlayer insulating layer 415a can be omitted, but embodiments of the present disclosure are not limited thereto.

In addition, the conductive layer TM1 can be disposed on the first interlayer insulating layer 414a. The conductive layer TM1 can be disposed at an upper side of the light blocking layer LS. However, the conductive layer TM1 can be omitted.

A third buffer layer 414b can be disposed on the second interlayer insulating layer 415a. However, the third buffer layer 414b can be omitted, but embodiments of the present disclosure are not limited thereto.

The first active layer ACT1 can be disposed on the third buffer layer 414b.

The first active layer ACT1 can be formed of an oxide semiconductor material. The oxide semiconductor material is a material having a larger band gap than silicon and has low off-current because electrons cannot pass through the band gap in an OFF state. Therefore, the transistor formed of the oxide semiconductor material can be applied to a switching transistor that maintains the short ON time and the long OFF time.

The first insulating layer 414c can be disposed on the first active layer ACT1.

The first gate electrode GE1 can be disposed on the first insulating layer 414c.

A third interlayer insulating layer 415d can be disposed on the first gate electrode GE1.

Further, the fifth source electrode SE5 and the fifth drain electrode DE5 can be disposed on the third interlayer insulating layer 415d. The fifth source electrode SE5 and the fifth drain electrode DE5 disposed to be spaced apart from each other can be electrically connected to the fifth active layer ACT5. In addition, the first source electrode SE1 and the first drain electrode DE1 can be disposed on the third interlayer insulating layer 415d. The first source electrode SE1 and the first drain electrode DE1 disposed to be spaced apart from each other can be electrically connected to the first active layer ACT1. The first source electrode SE1 can also be connected to the light blocking layer LS disposed under the first source electrode SE1, but embodiments of the present disclosure are not limited thereto.

The high-potential power line and the data line can be disposed on the third interlayer insulating layer 415d. For example, the high-potential power line and the data line can be disposed on the same layer as the first and fifth source electrodes SE1 and SE5 and the first and fifth drain electrodes DE1 and DE5 and formed of the same electrically conductive material as the first and fifth source electrodes SE1 and SE5 and the first and fifth drain electrodes DE1 and DE5, but embodiments of the present disclosure are not limited thereto.

A second insulating layer 414d can be disposed on the high-potential power line, the data line, the first and fifth source electrodes SE1 and SE5, and the first and fifth drain electrodes DE1 and DE5. The second insulating layer 414d is an insulating layer for protecting components disposed under the second insulating layer 414d. For example, the second insulating layer 414d can have a single layer or a plurality of layers formed of silicon oxide (SiOx) or silicon nitride (SiNx), but embodiments of the present disclosure are not limited thereto. In addition, the second insulating layer 414d can be omitted in accordance with embodiments of the present disclosure.

The third lower insulating layer 217 can be disposed on the second insulating layer 414d.

The components provided above the third lower insulating layer 217 are substantially identical to those according to the third embodiment of the present disclosure, and the repetitive description will be omitted.

The example in which the fifth active layer ACT5 of the fifth transistor T5 is formed of the low-temperature polysilicon and the first active layer ACT1 of the first transistor T1 is formed of the oxide semiconductor material has been described with reference to FIG. 10A, but embodiments of the present disclosure are not limited thereto. For example, the first active layer ACT1 can be formed of the oxide semiconductor material, or the fifth active layer ACT5 can be formed of the low-temperature polysilicon, but embodiments of the present disclosure are not limited thereto.

In the display apparatus according to the fourth embodiment of the present disclosure, the plurality of transistors T1 and T5 of the pixel circuit is configured by different types of transistors, thereby improving performance of the pixel circuit. The pixel circuit can include the plurality of transistors T1 and T5 and the capacitor, and the plurality of transistors can be configured by the different types of transistors T1 and T5. For example, among the plurality of transistors T1 and T5, some fifth transistors T5 can have the fifth active layers ACT5 formed of the low-temperature polysilicon, and the other first transistors T1 can have the first active layers ACT1 formed of the oxide semiconductor material. Because the fifth transistor T5 including the low-temperature polysilicon has high mobility and implements low power consumption, the fifth transistor T5 including the low-temperature polysilicon is applied to the driving transistor. Because the first transistor T1 including the oxide semiconductor material can maintain the short ON time and the long OFF time, the first transistor T1 including the oxide semiconductor material can be applied to the switching transistor. Therefore, in the display apparatus according to the fourth embodiment of the present disclosure, the first and fifth active layers ACT and ACT5 can be formed of different materials in consideration of the functions of the plurality of transistors T1 and T5 constituting the pixel circuit, thereby improving performance of the pixel circuit.

As another embodiment of the present disclosure, the first layer can be provided in plural. This configuration will be described in detail with reference to a fifth embodiment of the present disclosure.

Figure 11:
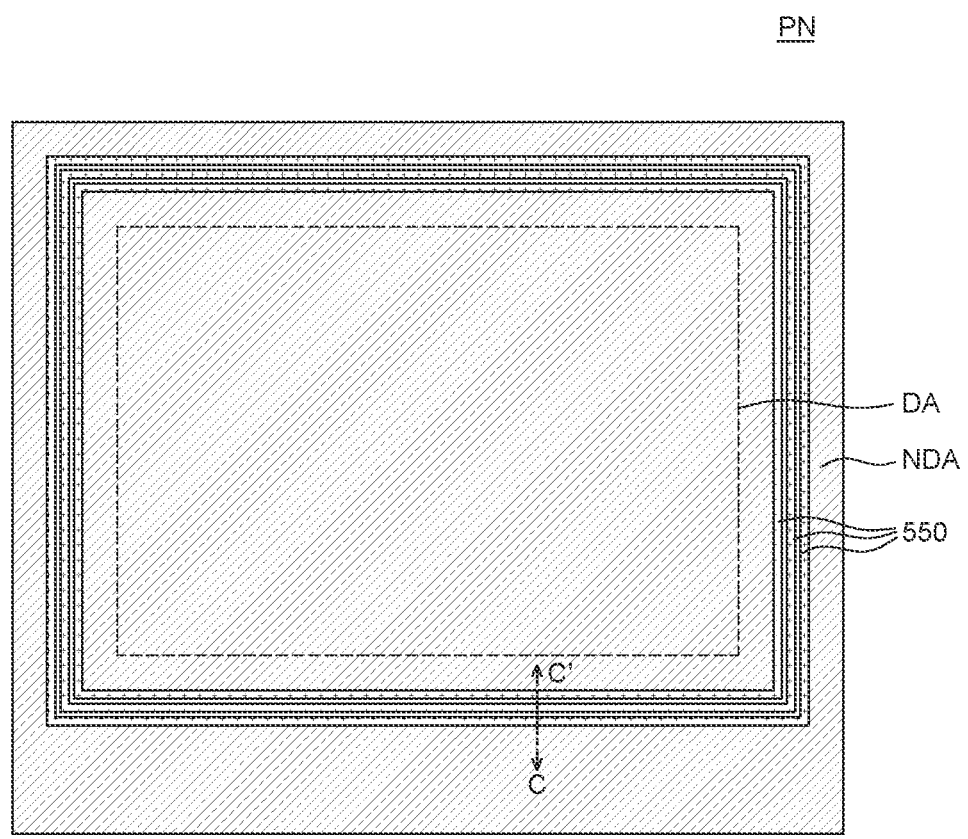
FIG. 11 is a top plan view of a display panel according to another embodiment of the present disclosure.

FIG. 11 is a top plan view of a display panel according to a fifth embodiment of the present disclosure.

Figure 12:
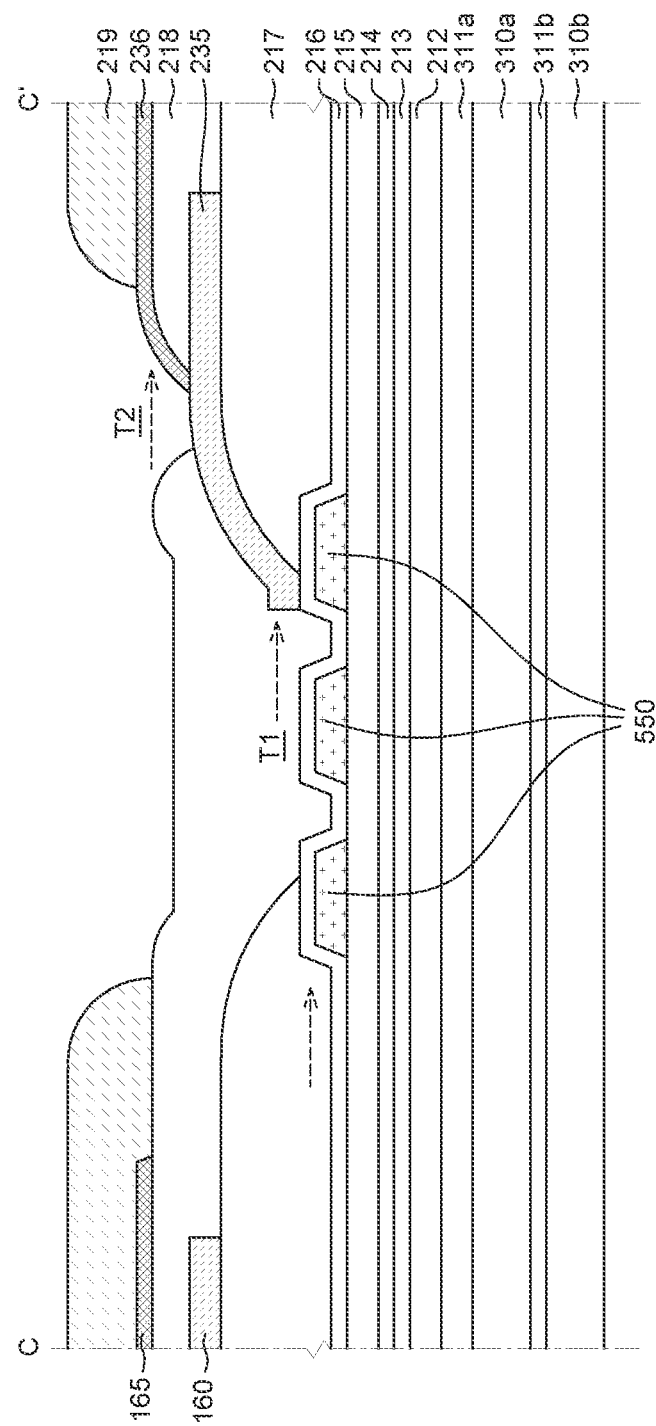
FIG. 12 is a cross-sectional view taken along line C-C' in FIG. 11 according to an embodiment of the present disclosure.

FIG. 12 is a cross-sectional view taken along line C-C' in FIG. 11.

The display apparatus illustrated in FIGS. 11 and 12 is different from the display apparatus illustrated in FIGS. 9A and 9B in terms of a configuration of the first layer, and the other components of the two apparatuses are substantially identical (e.g., FIG. 12 shows a type of double layered trench with three rows of moisture permeation preventing layers 550). For example, the moisture permeation preventing layers 550 can form three continuous and unbroken berms that extend all the way around the display area DA for protecting against moisture penetration. Therefore, the repetitive descriptions of the identical configurations will be omitted.

FIG. 12 is an enlarged view of a part of the non-display area NDA in which the source drive IC illustrated in FIG. 11 is positioned.

With reference to FIGS. 11 and 12, in the display apparatus according to the fifth embodiment of the present disclosure, the third lower insulating layer 217 can be disposed on the second insulating layer 216.

The components provided under the second insulating layer 216 are substantially identical to those according to the third embodiment of the present disclosure, and the repetitive description will be omitted.

The first hole T1 can be formed in the non-display area NDA at the periphery of the display area DA by removing the third lower insulating layer 217.

The first hole T1 can be disposed at the non-display area NDA so as to surround the edge or the periphery of the display area DA. Therefore, in the non-display area NDA, the first hole T1 divides the third lower insulating layer 217 into the two portions, for example, divides the third lower insulating layer 217 into inner and outer portions. As a result, it is possible to inhibit or prevent outside moisture from permeating into the display area DA through the third lower insulating layer 217.

A plurality of first layers 550 can be further disposed under the first hole T1, thereby further minimizing or reducing the permeation of moisture into the display area DA (e.g., two trenches/moats T1,T2 combined with three walls/banks of moisture permeation preventing layers 550). The first layer 550 can be a moisture permeation inhibiting layer or a moisture permeation preventing layer, but embodiments of the present disclosure are not limited by the term.

The plurality of first layers 550 can be disposed on the second interlayer insulating layer 215 under the first hole T1, and the second insulating layer 216 can be disposed on the plurality of first layers 550.

The plurality of first layers 550 can be disposed on the same layer as the source electrode and the drain electrode of the display area DA and formed of the same material as the source electrode and the drain electrode. The plurality of first layers 550 can be formed of an electrically conductive material, for example, copper (Cu), aluminum (Al), molybdenum (Mo), nickel (Ni), titanium (Ti), chromium (Cr), or an alloy thereof, but embodiments of the present disclosure are not limited thereto.

As described above, since the plurality of first layers 550 is disposed under the first hole T1, the second insulating layer 216 is laminated in an uneven manner on the plurality of first layers 550, such that a moisture permeation path is lengthened, and the plurality of first layers 550 blocks the permeation of moisture multiple times. As a result, it is possible to more effectively inhibit or prevent the permeation of moisture.

FIG. 12 illustrates an example in which the third lower insulating layer 217 is disposed to cover a part of the upper surface of some of the first layers 550, but embodiments of the present disclosure are not limited thereto.

As illustrated in FIG. 11, the plurality of first layers 550 can be disposed in layers to surround the edge or periphery of the display area DA (e.g., similar to rows of berms/mounds disposed around the display area DA for better moisture protection).

As another embodiment of the present disclosure, the third layer can be disposed not only inside the non-display area NDA, but also outside the non-display area NDA. This configuration will be described in detail with reference to a sixth embodiment of the present disclosure.

Figure 13:
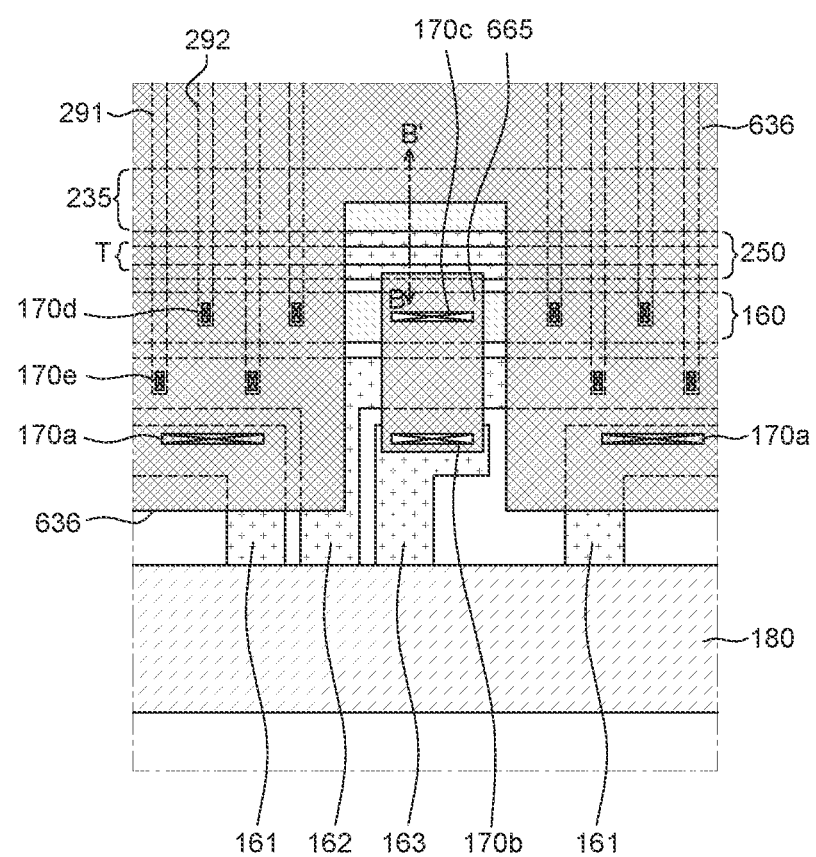
FIG. 13 is a top plan view illustrating an enlarged part of a non-display area of a display apparatus according to another embodiment of the present disclosure.

FIG. 13 is a top plan view illustrating an enlarged part of a non-display area of a display apparatus according to a sixth embodiment of the present disclosure.

Figure 14:
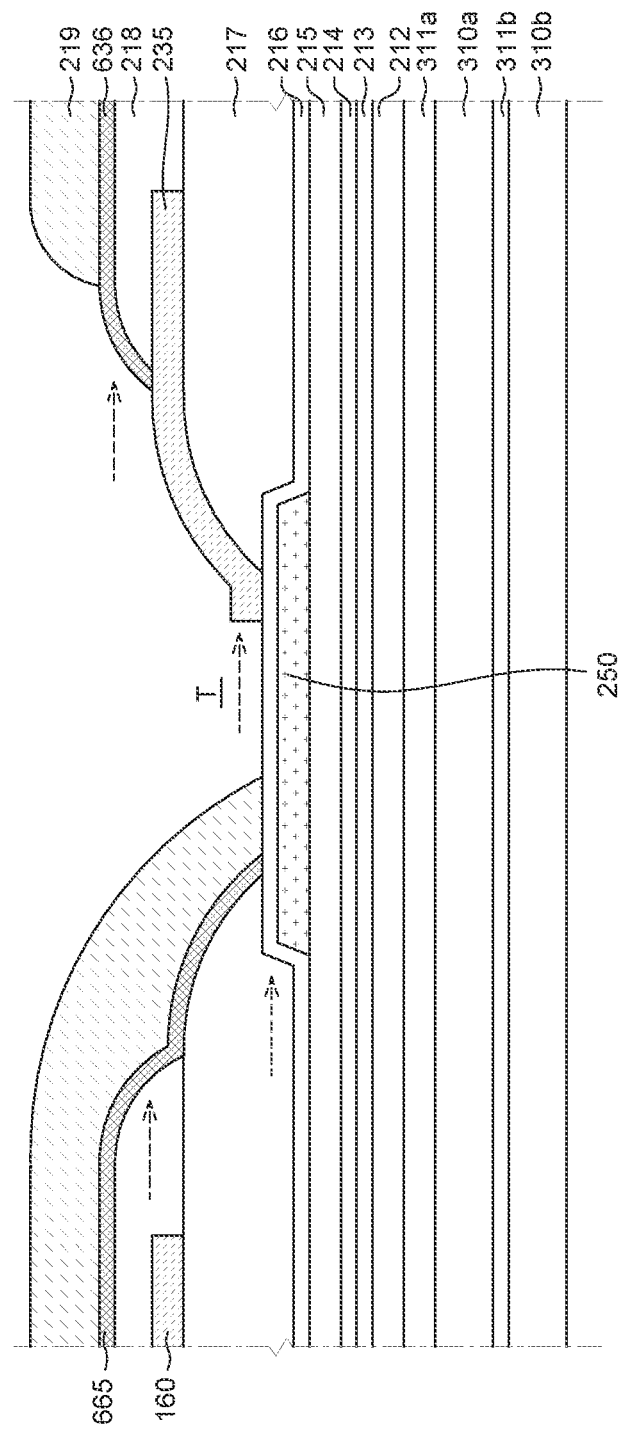
FIG. 14 is a cross-sectional view taken along line B-B' in FIG. 13 according to an embodiment of the present disclosure.

FIG. 14 is a cross-sectional view taken along line B-B' in FIG. 13.

The display apparatus illustrated in FIGS. 13 and 14 is different from the display apparatus illustrated in FIGS. 9A and 9B in terms of configurations of the hole, the third layer, the third upper insulating layer, and the bank, and the other components the two apparatuses are substantially identical. Therefore, the repetitive descriptions of the identical configurations will be omitted.

With reference to FIGS. 13 and 14, in the display apparatus according to the sixth embodiment of the present disclosure, the third lower insulating layer 217 can be disposed on the second insulating layer 216.

The components provided under the second insulating layer 216 are substantially identical to those according to the third embodiment of the present disclosure, and the repetitive description will be omitted.

As described above, the hole T can be formed in the non-display area NDA at the periphery of the display area DA by removing the third lower insulating layer 217.

The hole T can be disposed at the non-display area NDA so as to surround the edge or the periphery of the display area DA. Therefore, in the non-display area NDA, the hole T divides the third lower insulating layer 217 into the two portions, for example, the inner and outer portions. As a result, it is possible to inhibit or prevent outside moisture from permeating into the display area DA through the third lower insulating layer 217.

The first layer 250 can be further disposed under the hole T, thereby minimizing or reducing the permeation of moisture into the display area DA.

The first layer 250 can be disposed on the second interlayer insulating layer 215 under the hole T, and the second insulating layer 216 can be disposed on the first layer 250.

According to the sixth embodiment of the present disclosure, the hole T can be formed in the non-display area NDA at the periphery of the display area DA by removing the third lower insulating layer 217, such that the second insulating layer 216 under the hole T can be exposed.

The lateral surface of the third lower insulating layer 217 disposed at the edge or the periphery of the display area DA is also exposed through the hole T. The second layer 235 can be disposed to cover the exposed lateral surface of the third lower insulating layer 217 at the edge or the periphery of the display area DA.

The second layer 235 according to the sixth embodiment of the present disclosure can be disposed to cover the exposed lateral surface of the third lower insulating layer 217 from the upper surface of the third lower insulating layer 217 inside the non-display area NDA. In addition, the second layer 235 can extend to the upper surface of the second insulating layer 216. Therefore, one end or one portion of the second layer 235 can adjoin the upper surface of the second insulating layer 216.

The third upper insulating layer 218 disposed outside the non-display area NDA can be disposed to cover a part of the upper surface of the third lower insulating layer 217 in the non-display area NDA. The third upper insulating layer 218 in the non-display area NDA can be disposed to cover a part of the upper surface of the second layer 235. That is, the hole T can divide the third upper insulating layer 218 into the inner and outer portions in the non-display area NDA and isolate the inner and outer portions.

According to the sixth embodiment of the present disclosure, a third layer 636 can be disposed to cover a part of the upper surface and the lateral surface of the third upper insulating layer 218 in the non-display area NDA. For example, a part of the upper surface and the lateral surface of the third upper insulating layer 218 in the non-display area NDA can be covered by the third layer 636. The third layer 636 can extend to the upper surface of the second layer 235 to cover the lateral surface of the third upper insulating layer 218 from the upper surface of the third upper insulating layer 218 in the non-display area NDA. Therefore, one end or one portion of the third layer 636 can adjoin or contact the upper surface of the second layer 235.

In addition, according to the sixth embodiment of the present disclosure, a connection electrode 665 can be disposed to cover the lateral surface of the third lower insulating layer 217 and a part of the upper surface and the lateral surface of the third upper insulating layer 218 in the non-display area NDA. For example, a part of the upper surface and the lateral surface of the third upper insulating layer 218 outside the non-display area NDA can be covered by the connection electrode 665, and the lateral surface of the third lower insulating layer 217 outside the non-display area NDA can be covered by the connection electrode 665. For example, according to the sixth embodiment of the present disclosure, the connection electrode 665 can extend to the upper surface of the second insulating layer 216 so as to cover the lateral surface of the third upper insulating layer 218 from the upper surface of the third upper insulating layer 218 outside the non-display area NDA and to cover the lateral surface of the third lower insulating layer 217 outside the non-display area NDA. Therefore, one end or one portion of the connection electrode 665 can adjoin or contact the upper surface of the second insulating layer 216.

The third layer 636 inside the non-display area NDA and the connection electrode 665 outside the non-display area NDA can be disposed on the same layer as the first electrode of the display area DA and formed of the same material as the first electrode. Therefore, for example, the third layer 636 and the connection electrode 665 can be formed of an electrically conductive transparent material such as indium tin oxide (ITO) or indium zinc oxide (IZO), but the present specification is not limited thereto. In the situation of the top emission type display apparatus, the third layer 636 and the connection electrode 665 can further include a reflective layer formed of a material such as aluminum (Al) or silver (Ag).

According to the sixth embodiment of the present disclosure, the bank 219 may not be disposed at a part of a portion between the hole T and the non-display area NDA. For example, the bank 219 can be divided with the hole T interposed therebetween. One part of the bank 219 can be disposed to cover the upper surface of the third layer 636, and another part of the bank 219 can be disposed to cover the lateral surface of the connection electrode 665 from the upper surface of the connection electrode 665 and to cover a part of the upper surface of the second insulating layer 216.

In this situation, a part of the upper surface and the lateral surface of the second layer 235 and a part of the upper surface and the lateral surface of the third layer 636 can be exposed, but embodiments of the present disclosure are not limited thereto.

According to the sixth embodiment of the present disclosure, since the second layer 235 and the third layer 636 are formed in a stepwise manner so as to have two or more types of metal layers, it is possible to minimize or reduce the permeation of moisture from the outside (see the arrows illustrated in FIG. 14, e.g., similar to a trench having both sides having multiple layers of seals or a trench having reinforced sides).

Figure 15:
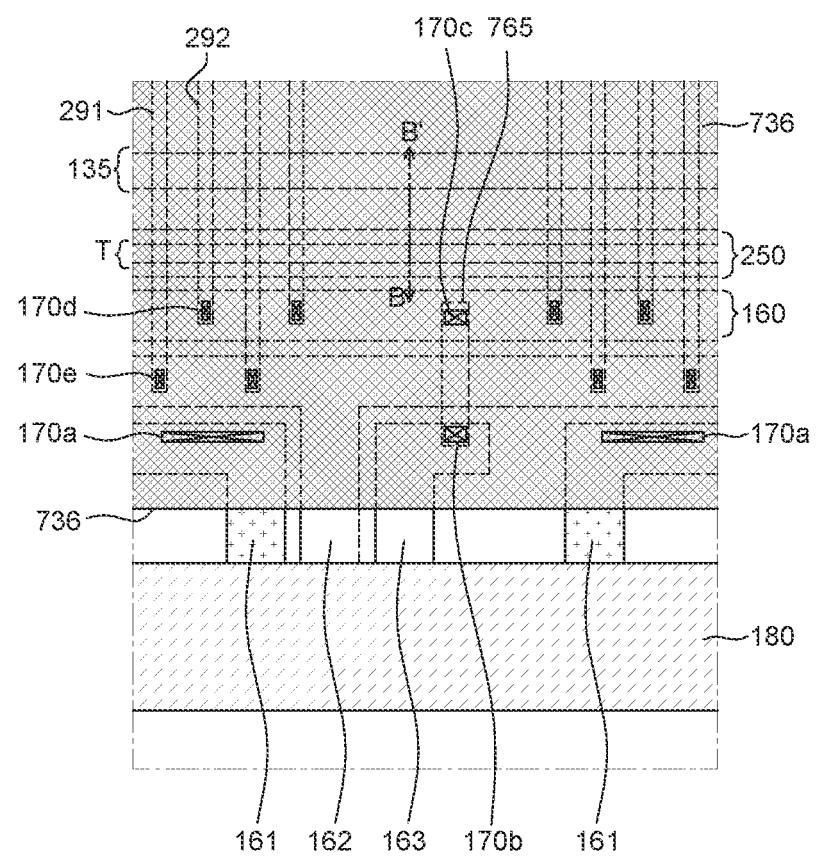
FIG. 15 is a top plan view illustrating an enlarged part of a non-display area of a display apparatus according to another embodiment of the present disclosure.

In addition, according to the sixth embodiment of the present disclosure, the connection electrode 665 can be formed to cover the third upper insulating layer 218 and the third lower insulating layer 217 not only at the periphery inside the non-display area NDA, but also at the periphery outside the non-display area NDA. As a result, it is possible to block the permeation of moisture before the hole T. FIG. 15 is a top plan view illustrating an enlarged part of a non-display area of a display apparatus according to a seventh embodiment of the present disclosure.

Figure 16:
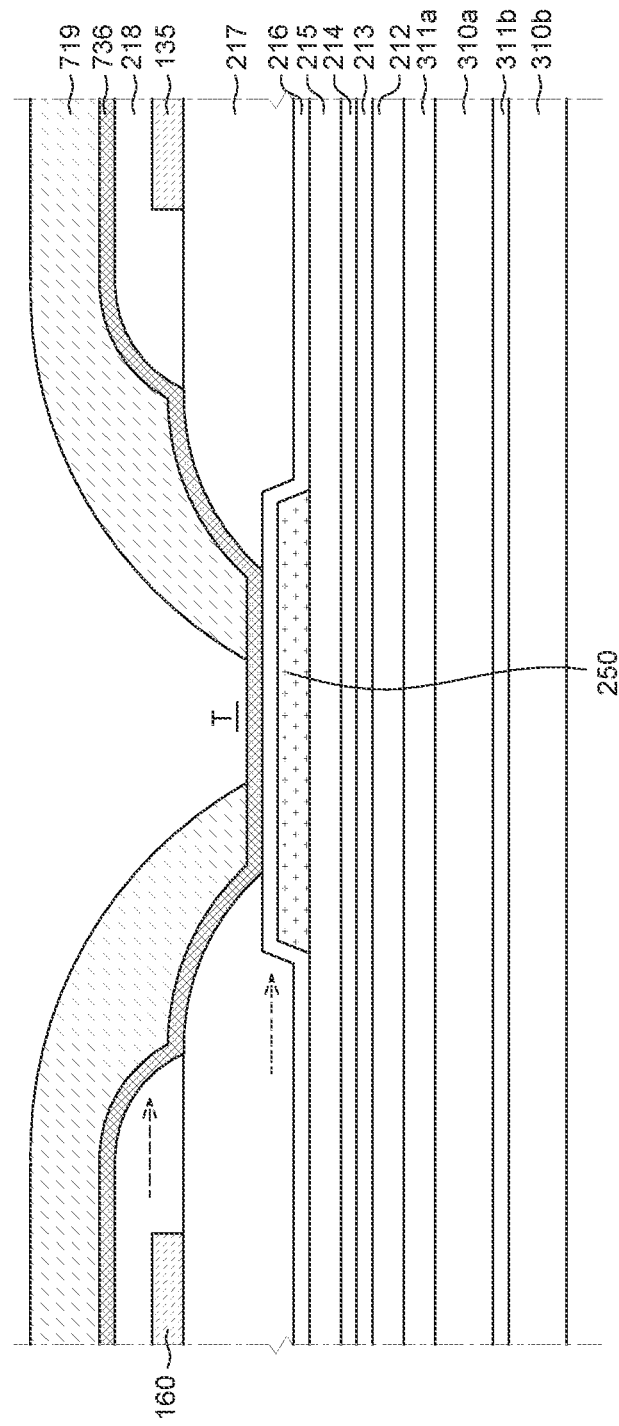
FIG. 16 is a cross-sectional view taken along line B-B' in FIG. 15 according to an embodiment of the present disclosure.

FIG. 16 is a cross-sectional view taken along line B-B' in FIG. 15.

The display apparatus illustrated in FIGS. 15 and 16 is different from the display apparatus illustrated in FIGS. 13 and 14 in terms of configurations of the hole and the second and third layers, and the other components of the two apparatuses are substantially identical. Therefore, the repetitive descriptions of the identical configurations will be omitted.

With reference to FIGS. 15 and 16, in the display apparatus according to the seventh embodiment of the present disclosure, the third lower insulating layer 217 can be disposed on the second insulating layer 216.

The components provided under the second insulating layer 216 are substantially identical to those according to the third embodiment of the present disclosure, and the repetitive description will be omitted.

As described above, the hole T can be formed in the non-display area NDA at the periphery of the display area DA by removing the third lower insulating layer 217.

The first layer 250 can be further disposed under the hole T, thereby minimizing or reducing the permeation of moisture into the display area DA.

The hole T can divide the third lower insulating layer 217 into the inner and outer portions in the non-display area NDA. The lateral surface of the third lower insulating layer 217 can be exposed through the hole T.

According to the seventh embodiment of the present disclosure, the third upper insulating layer 218 inside the non-display area NDA can be disposed to cover a part of the upper surface of the third lower insulating layer 217 inside the non-display area NDA, and the third upper insulating layer 218 outside the non-display area NDA can be disposed to cover a part of the upper surface of the third lower insulating layer 217 outside the non-display area NDA. That is, the hole T can divide the third upper insulating layer 218 into the third upper insulating layer 218 inside the non-display area NDA and the third upper insulating layer 218 outside the non-display area NDA and isolate the third upper insulating layer 218 into the third upper insulating layer 218 inside the non-display area NDA and the third upper insulating layer 218 outside the non-display area NDA.

According to the seventh embodiment of the present disclosure, a third layer 736 can be disposed to cover a part of the upper surface and the lateral surface of the third upper insulating layer 218 and the lateral surface of the third lower insulating layer 217. For example, the third layer 736 according to the seventh embodiment of the present disclosure can be formed to cover the lateral surface of the third upper insulating layer 218 from the upper surface of the third upper insulating layer 218 inside the non-display area NDA, the upper surface of the third lower insulating layer 217 inside the non-display area NDA, the lateral surface of the third upper insulating layer 218 from the upper surface of the third upper insulating layer 218 outside the non-display area NDA, the upper surface of the third lower insulating layer 217 outside the non-display area NDA, and the hole T (e.g., a trench in which the bottom of the trench and the sides of the trench are covered with the third layer 736 for better sealing/moisture prevention). Therefore, the third layer 736 can adjoin the upper surface of the second insulating layer 216 exposed through the hole T. In this situation, the third layer 736 can constitute the connection electrodes according to the above-mentioned embodiments of the present disclosure. However, embodiments of the present disclosure are not limited thereto.

The third layer 736 can be disposed on the same layer as the first electrode of the display area DA and formed of the same material as the first electrode. The third electrode 736 can be formed of an electrically conductive transparent material such as indium tin oxide (ITO) or indium zinc oxide (IZO), but embodiments of the present disclosure are not limited thereto. In the situation of the top emission type display apparatus, the third layer 736 can further include a reflective layer formed of a material such as aluminum (Al) or silver (Ag).

According to the seventh embodiment of the present disclosure, the bank 719 may not be disposed at the hole T (e.g., the bank 719 can also help seal both sides of the trench but can be absent from the center/bottom of the trench). For example, the bank 719 can be divided with the inner and outer portions of the non-display area NDA interposed therebetween. One part of the bank 719 can be disposed to cover a part of the third layer 736 inside the non-display area NDA, and another part of the bank 719 can be disposed to cover a part of the third layer 736 outside the non-display area NDA.

In this situation, the upper surface of the third layer 736 above the hole T can be exposed (e.g., upper surface of the third layer 736 can be exposed by the bank layers at the center or middle of the trench), but embodiments of the present disclosure are not limited thereto.

According to the seventh embodiment of the present specification, the third layer 736 can be formed in a stepwise manner so as to have a single type of metal layer, such that a deep stepped portion is formed and the hole T is not exposed to the outside, thereby minimizing or reducing the permeation of moisture from the outside.

In addition, according to the seventh embodiment of the present disclosure, the third layer 736 can be formed not only at the periphery inside the non-display area NDA, but also at the periphery outside the non-display area NDA. As a result, it is possible to block the permeation of moisture before the hole T.

Figure 17:
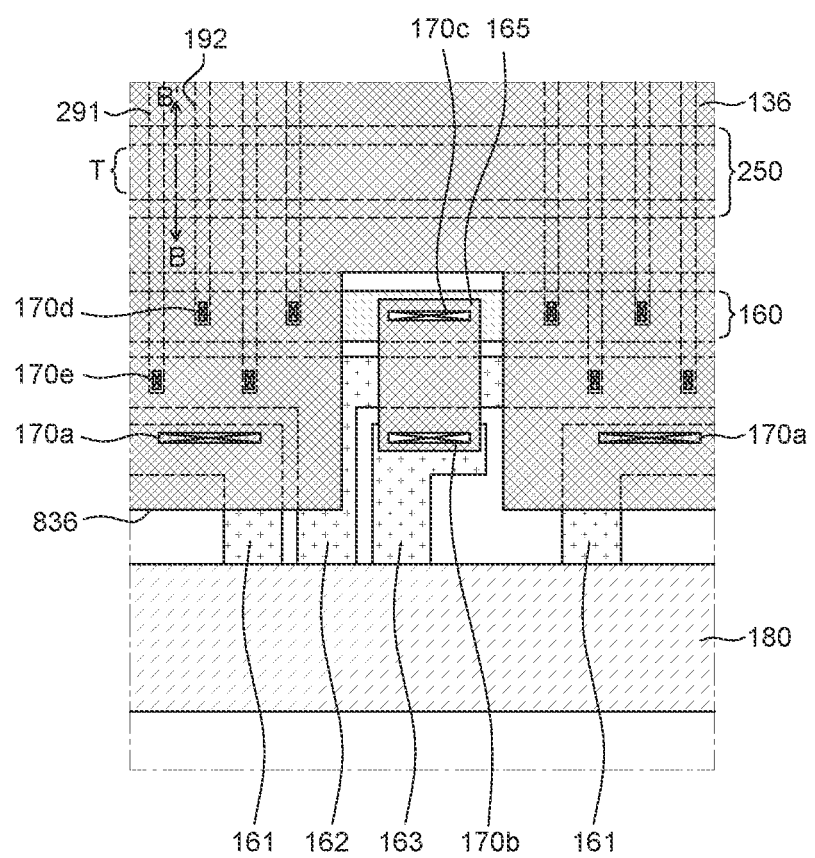
FIG. 17 is a top plan view of a display panel according to another embodiment of the present disclosure.

FIG. 17 is a top plan view of a display panel according to an eighth embodiment of the present disclosure.

Figure 18:
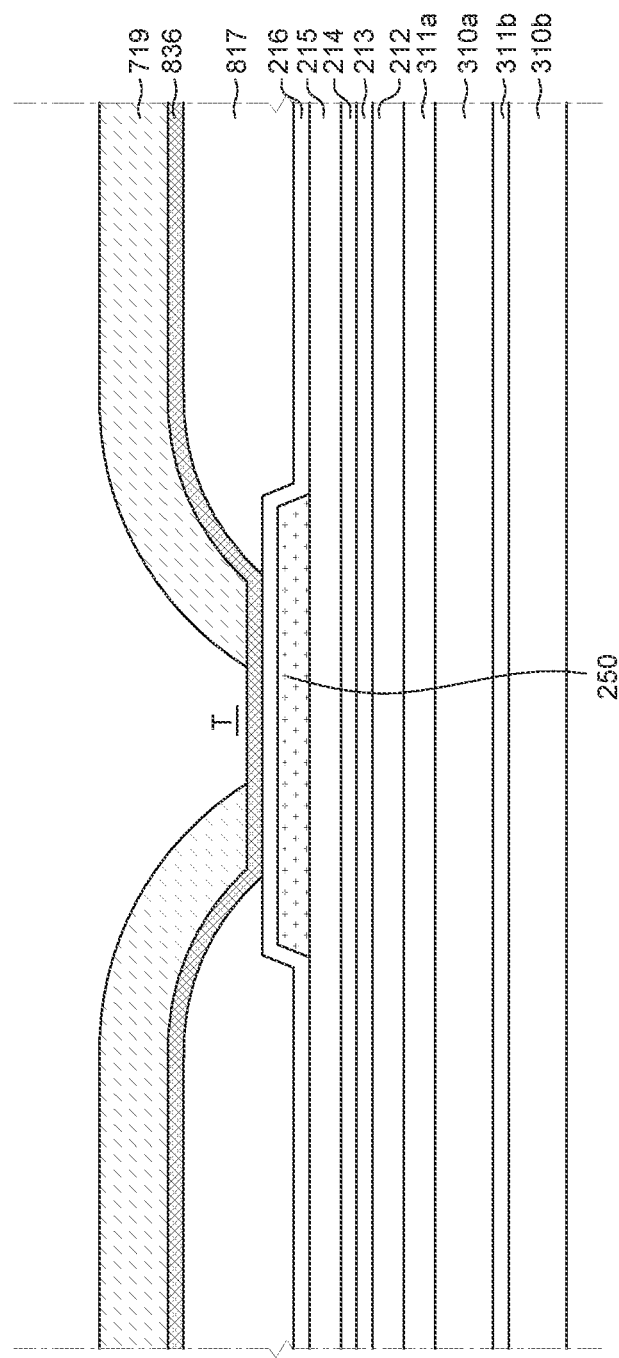
FIG. 18 is a cross-sectional view taken along line B-B' in FIG. 13 according to an embodiment of the present disclosure Throughout the drawings and the detailed description, unless otherwise described, the same drawing reference numerals should be understood to refer to the same elements, features, and structures. The relative size and depiction of these elements may be exaggerated for clarity, illustration, and convenience.

FIG. 18 is a cross-sectional view taken along line B-B' in FIG. 13.

The display apparatus illustrated in FIGS. 17 and 18 is different from the display apparatus illustrated in FIGS. 15 and 16 in that a single third insulating layer is applied, and the other components of the two apparatuses are substantially identical. Therefore, the repetitive descriptions of the identical configurations will be omitted.

In FIG. 18, the left side is the outside of the non-display area NDA, and the right side is the inside of the non-display area NDA.

With reference to FIGS. 17 and 18, in the display apparatus according to the eighth embodiment of the present disclosure, a third insulating layer 817 can be disposed on the second insulating layer 216. The third insulating layer 817 can be a planarization layer, but embodiments of the present disclosure are not limited thereto.

The eighth embodiment of the present disclosure can have the single third insulating layer 817. The third insulating layer 817 can be formed of an organic material. For example, the third insulating layer 817 can have a single layer or a plurality of layers formed of polyimide or photo acryl, but embodiments of the present disclosure are not limited thereto.

The components provided under the second insulating layer 216 are substantially identical to those according to the third embodiment of the present disclosure, and the repetitive description will be omitted.

As described above, the hole T can be formed in the non-display area NDA at the periphery of the display area DA by removing the third insulating layer 817.

The first layer 250 can be further disposed under the hole T, thereby minimizing or reducing the permeation of moisture into the display area DA.

The hole T can divide the third insulating layer 817 into the inner and outer portions in the non-display area NDA. The lateral surface of the third insulating layer 817 can be exposed through the hole T.

The hole T can divide the third insulating layer 817 into the third insulating layer 817 inside the non-display area NDA and the third insulating layer 817 outside the non-display area NDA and isolate the third insulating layer 817 into the third insulating layer 817 inside the non-display area NDA and the third insulating layer 817 outside the non-display area NDA.

According to the eighth embodiment of the present disclosure, a third layer 836 can be disposed to cover a part of an upper surface and a lateral surface of the third insulating layer 817. For example, according to the eighth embodiment of the present disclosure, the third layer 836 can be formed to cover a lateral surface of the third insulating layer 817 inside the non-display area NDA from an upper surface of the third insulating layer 817 inside the non-display area NDA, a lateral surface of the third insulating layer 817 outside the non-display area NDA from an upper surface of the third insulating layer 817 outside the non-display area NDA, and the hole T. Therefore, the third layer 836 can adjoin or contact the upper surface of the second insulating layer 216 exposed through the hole T.

The third layer 836 can be disposed on the same layer as the first electrode of the display area DA and formed of the same material as the first electrode. The third electrode 836 can be formed of an electrically conductive transparent material such as indium tin oxide (ITO) or indium zinc oxide (IZO), but embodiments of the present disclosure are not limited thereto. In the situation of the top emission type display apparatus, the third layer 836 can further include a reflective layer formed of a material such as aluminum (Al) or silver (Ag).

According to the eighth embodiment of the present disclosure, the bank 719 may not be disposed at the hole T. For example, the bank 719 can be divided with the inner and outer portions of the non-display area NDA interposed therebetween. One part of the bank 719 can be disposed to cover a part of the third layer 836 inside the non-display area NDA, and another part of the bank 719 can be disposed to cover a part of the third layer 836 outside the non-display area NDA.

In this situation, the upper surface of the third layer 836 above the hole T can be exposed, but embodiments of the present disclosure are not limited thereto.

The first to eighth embodiments of the present disclosure can be coupled or combined.

The embodiments of the present disclosure can be described as follows.

According to an embodiment of the present disclosure, a display apparatus includes a substrate comprising a plurality of subpixels, a display area, and a non-display area, an insulating layer disposed on the substrate, a plurality of first electrodes disposed on the insulating layer and disposed at the plurality of subpixels, respectively, a bank disposed between the plurality of subpixels, a hole configured to divide the insulating layer into an insulating layer of an inner portion of the non-display area and an insulating layer of an outer portion of the non-display area at the non-display area of a periphery of the display area, a first layer disposed under the hole between the inner portion of the non-display area and the outer portion of the non-display area, and an organic layer and a second electrode disposed on the plurality of first electrodes.

According to some embodiments of the present disclosure, the first insulating layer is disposed at the inner portion of the non-display area and the second insulating layer is disposed at the outer portion of the non-display area.

According to some embodiments of the present disclosure, the substrate can include a first substrate and a second substrate formed of polyimide, and the display apparatus can further include a buffer layer disposed between the first substrate and the second substrate.

According to some embodiments of the present disclosure, the display apparatus can further include a transistor disposed on the substrate, in which the transistor can include a driving transistor formed of polysilicon, and a switching transistor formed of an oxide semiconductor material.

According to some embodiments of the present disclosure, the insulating layer can include a lower insulating layer disposed on the substrate, and an upper insulating layer disposed on the lower insulating layer.

According to some embodiments of the present disclosure, the display apparatus can further include another insulating layer disposed on the first layer, in which a lateral surface of the insulating layer and a part of an upper surface of another insulating layer can be exposed through the hole.

According to some embodiments of the present disclosure, the bank can cover the exposed part of the upper surface of another insulating layer.

According to some embodiments of the present disclosure, the hole can surround a periphery of the display area, and the first layer can be disposed along the hole.

According to some embodiments of the present disclosure, the hole between the inner portion of the non-display area and the outer portion of the non-display area can include a first hole configured to divide the lower insulating layer into the lower insulating layer of the inner portion of the non-display area and the lower insulating layer of the outer portion of the non-display area, and a second hole configured to divide the upper insulating layer into the upper insulating layer of the inner portion of the non-display area and the upper insulating layer of the outer portion of the non-display area.

According to some embodiments of the present disclosure, the display apparatus can further include a second layer configured to cover a lateral surface of the lower insulating layer of the inner portion of the non-display area, which is exposed through the first hole.

According to some embodiments of the present disclosure, the second layer can be disposed on the lower insulating layer of the inner portion of the non-display area and covers the exposed lateral surface of the lower insulating layer from a upper surface of the lower insulating layer of the inner portion of the non-display area.

According to some embodiments of the present disclosure, the second layer can extend to the upper surface of another insulating layer, and one portion of the second layer can adjoin the upper surface of another insulating layer.

According to some embodiments of the present disclosure, the upper insulating layer of the inner portion of the non-display area can cover a part of an upper surface of the second layer, and the upper insulating layer of the outer portion of the non-display area can cover a lateral surface and another part of the upper surface of the second layer.

According to some embodiments of the present disclosure, the second hole can be disposed between the first hole and the display area at the inner portion of the non-display area and can surround a periphery of the display area.

According to some embodiments of the present disclosure, the display apparatus can further include a third layer disposed to cover a lateral surface of the upper insulating layer of the inner portion of the non-display area from an upper surface of the upper insulating layer of the inner portion of the non-display area.

According to some embodiments of the present disclosure, one portion of the third layer can extend to an upper surface of the second layer and adjoins the upper surface of the second layer.

According to some embodiments of the present disclosure, the first layer can be provided in plural, and the plurality of first layers can surround a periphery of the display area.

According to some embodiments of the present disclosure, by the hole can be configured that the lower insulating layer can be divided into the lower insulating layer of the inner portion of the non-display area and the lower insulating layer of the outer portion of the non-display area, and the upper insulating layer can be divided into the upper insulating layer of the inner portion of the non-display area and the upper insulating layer of the outer portion of the non-display area.

According to some embodiments of the present disclosure, the display apparatus can further include a second layer configured to cover a lateral surface of the lower insulating layer of the inner portion of the non-display area, which is exposed through the hole.

According to some embodiments of the present disclosure, the upper insulating layer of the inner portion of the non-display area can cover a part of an upper surface of the second layer, and the upper insulating layer of the outer portion of the non-display area can cover an upper surface of the lower insulating layer of the outer portion of the non-display area.

According to some embodiments of the present disclosure, the display apparatus can further include a third layer of the inner portion of the non-display area which covers a lateral surface of the upper insulating layer of the inner portion of the non-display area from an upper surface of the upper insulating layer inside the non-display area, and a third layer of the outer portion of the non-display area which covers a lateral surface of the upper insulating layer of the outer portion of the non-display area from an upper surface of the upper insulating layer of the outer portion of the non-display area and covers a lateral surface of the lower insulating layer of the outer portion of the non-display area.

According to some embodiments of the present disclosure, the display apparatus can further include a third layer configured to cover a lateral surface of the upper insulating layer of the inner portion of the non-display area from an upper surface of the upper insulating layer of the inner portion of the non-display area, an upper surface of another insulating layer exposed through the hole, a lateral surface of the upper insulating layer of the outer portion of the non-display area from an upper surface of the upper insulating layer of the outer portion of the non-display area, and a lateral surface of the lower insulating layer of the outer portion of the non-display area.

According to some embodiments of the present disclosure, the display apparatus can further include a third layer configured to cover a lateral surface of the insulating layer of the inner portion of the non-display area from an upper surface of the insulating layer of the inner portion of the non-display area, an upper surface of another insulating layer exposed through the hole, and a lateral surface of the insulating layer of the outer portion of the non-display area from an upper surface of the insulating layer of the outer portion of the non-display area.

According to some embodiments of the present disclosure, the display apparatus can further include a link line disposed at the non-display area; and a power line disposed from the non-display area to the display area, in which the power line can be disposed on a layer different from a layer on which the first and second layers are disposed, and the power line can be connected to the link line through a contact hole.

It will be apparent to those skilled in the art that various modifications and variations can be made in the display apparatus including the same of the present disclosure without departing from the technical idea or scope of the disclosures. Thus, it can be intended that embodiments of the present disclosure cover the modifications and variations of the disclosure provided they come within the scope of the appended claims and their equivalents.

What is claimed is:

1. A display apparatus, comprising:
    a substrate comprising a plurality of subpixels, a display area, and a non-display area;
    a first insulating layer disposed on the substrate;
    a plurality of first electrodes disposed on the first insulating layer and disposed at the plurality of subpixels, respectively;
    a bank disposed between the plurality of subpixels;
    a hole configured to divide the first insulating layer into an inner first insulating layer portion and an outer first insulating layer portion in the non-display area at a periphery of the display area, the inner first insulating layer portion being closer to the display area than the outer first insulating layer portion;
    a first layer disposed under the hole between the inner first insulating layer portion and the outer first insulating layer portion and formed of a conductive material; and
    an organic layer and a second electrode disposed on the plurality of first electrodes.

2. The display apparatus of claim 1, wherein the hole extends through the first insulating layer and forms a first trench surrounding the display area.

3. The display apparatus of claim 2, wherein the first layer is disposed under the first trench and along the periphery of the display area.

4. The display apparatus of claim 1, wherein the substrate comprises a first substrate and a second substrate, and
    wherein the display apparatus further includes a buffer layer between the first substrate and the second substrate.

5. The display apparatus of claim 1, further comprising:
    a plurality of transistors disposed on the substrate,
    wherein the plurality of transistors including a driving transistor including polysilicon, and a switching transistor including an oxide semiconductor material.

6. The display apparatus of claim 1, wherein the first insulating layer comprises:
    a lower first insulating layer disposed on the substrate; and
    an upper first insulating layer disposed on the lower first insulating layer.

7. The display apparatus of claim 6, wherein the hole comprises:
    a first hole configured to divide the lower first insulating layer into a lower first inner insulating portion and a lower first outer insulating portion, the lower first inner insulating portion being closer to the display area than the lower first outer insulating portion; and
    a second hole configured to divide the upper first insulating layer into an upper first inner insulating portion and an upper first outer insulating portion, the upper first inner insulating portion being closer to the display area than the upper first outer insulating portion.

8. The display apparatus of claim 7, further comprising:
    a second layer disposed on a lateral surface of the lower first inner insulating portion.

9. The display apparatus of claim 8, further comprising:
a second insulating layer disposed on the first layer,
wherein the second layer extends to an upper surface of the second insulating layer, and a portion of the second layer contacts the upper surface of the second insulating layer.

10. The display apparatus of claim 8, wherein the upper first insulating layer covers a part of an upper surface of the second layer and a lateral surface the second layer.

11. The display apparatus of claim 8, further comprising:
a link line disposed at the non-display area; and
a power line disposed from the non-display area to the display area,
wherein the power line is disposed on a layer different from a layer on which the first and second layers are disposed, and
wherein the power line is connected to the link line through a contact hole.

12. The display apparatus of claim 8, further comprising:
a third layer disposed on a lateral surface of the upper first inner insulating portion.

13. The display apparatus of claim 12, wherein the third layer extends to an upper surface of the second layer, and a portion of the third layer contacts the upper surface of the second layer.

14. The display apparatus of claim 7, wherein the second hole is disposed between the first hole and the display area, and the second hole forms a second trench surrounding the display area.

15. The display apparatus of claim 1, further comprising:
a second insulating layer disposed on the first layer,
wherein a lateral surface of the first insulating layer and an exposed part of an upper surface of the second insulating layer are exposed through the hole.

16. The display apparatus of claim 15, wherein the bank extends across the hole and covers the exposed part of the upper surface of the second insulating layer.

17. The display apparatus of claim 1, wherein the first layer comprises a plurality of mounds that surround the periphery of the display area.

18. The display apparatus of claim 1, further comprising:
a second insulating layer disposed on the first layer; and
a third layer extending across the hole and covering a lateral surface of the inner first insulating portion, an exposed part of an upper surface of second insulating layer exposed through the hole and a lateral surface of the outer first insulating portion.

19. A display apparatus, comprising:
a substrate comprising a plurality of subpixels, a display area, and a non-display area;
a first insulating layer disposed on the substrate,
wherein in the non-display area, the first insulating layer includes a lower first insulating layer disposed on the substrate and an upper first insulating layer disposed on the lower first insulating layer;
a hole configured to divide the first insulating layer into an inner first insulating layer portion and an outer first insulating layer portion in the non-display area at a periphery of the display area, the inner first insulating layer portion being closer to the display area than the outer first insulating layer portion;
a bank disposed on the upper first insulating layer in the non-display area,
wherein the upper first insulating layer and the bank are disposed at both sides of the hole; and
a first layer disposed under the hole between the inner first insulating layer portion and the outer first insulating layer portion.

20. The display apparatus of claim 19, wherein the hole is configured to:
divide the lower first insulating layer into a lower first inner insulating portion and a lower first outer insulating portion, the lower first inner insulating portion being closer to the display area than the lower first outer insulating portion, and
divide the upper first insulating layer into an upper first inner insulating portion and an upper first outer insulating portion, the upper first inner insulating portion being closer to the display area than the upper first outer insulating portion.

21. The display apparatus of claim 20, further comprising:
a second layer disposed on a lateral surface of the lower first inner insulating portion.

22. The display apparatus of claim 21, wherein the upper first insulating layer covers a part of an upper surface of the second layer and a lateral surface the second layer.

23. The display apparatus of claim 21, further comprising:
a third layer disposed on a lateral surface of the upper first inner insulating portion.

* * * * *